US005684713A

United States Patent [19]
Asada et al.

[11] Patent Number: 5,684,713
[45] Date of Patent: Nov. 4, 1997

[54] METHOD AND APPARATUS FOR THE RECURSIVE DESIGN OF PHYSICAL STRUCTURES

[75] Inventors: Haruhiko Asada, Concord; Anton C. Pil, Cambridge, both of Mass.

[73] Assignee: Massachusetts Institute of Technology, Cambridge, Mass.

[21] Appl. No.: 86,343

[22] Filed: Jun. 30, 1993

[51] Int. Cl.⁶ .............................. G06F 17/00; G06F 17/50
[52] U.S. Cl. .................................... 364/512; 364/474.24
[58] Field of Search ............................ 364/512, 474.24, 364/552, 578

[56] References Cited

U.S. PATENT DOCUMENTS

| | | | |
|---|---|---|---|
| 3,939,020 | 2/1976 | Caramanian | 156/64 |
| 5,109,589 | 5/1992 | Cramer et al. | 29/527.4 |
| 5,260,883 | 11/1993 | Wilson | 364/512 |
| 5,297,057 | 3/1994 | Kramer et al. | 364/512 |
| 5,311,784 | 5/1994 | Girard et al. | 364/474.24 X |

OTHER PUBLICATIONS

Park, J. and Asada, H., "Integrated Structure/Control Design of a Two–Link Nonrigid Robot Arm for High Speed Positioning," Proceedings of the 1992 IEEE International Conference on Robotics and Automation, Nice, France, May 12–14, 1992.

Ashley, S., "Rapid Prototyping Systems," *Mechanical Engineering*, p. 34 and following (Apr. 1991).

Deitz, D., "Stereolithography Automates Prototyping", *Mechanical Engineering*, p. 34 (Feb. 1990).

Sachs, E., et al., "CAD–Casting: Direct Fabrication of Ceramic Shells and Cores by Three Dimensional Printing," *Manufacturing Review*, vol. 5, No. 2, Jun. 1992, pp. 117–126.

Ting, T., Chen, T. L. C. and Twomey, W. J., "Finite element model refinement with actual forced responses of structures," *Finite Elements in Analysis and Design*, V. 11, pp. 213–220, Elsevier Science Publishers, B.V. (Nov. 1992).

Choi, Y., Sprecher, A. F., and Conrad, H., "Vibration Characteristics of a Composite Beam Containing an Electrorheological Fluid," *Journal of Intelligent Materials Systems and Structures*, vol. 1, pp. 91–103, Technomic Publishing Co., Inc. (Jan. 1990).

(List continued on next page.)

*Primary Examiner*—Emanuel T. Voeltz
*Assistant Examiner*—Edward Pipala
*Attorney, Agent, or Firm*—Steven J. Weissburg

[57] ABSTRACT

In a method and an apparatus for automatically fabricating a physical prototype, an initial prototype is created, which need not satisfy the specified performance characteristics. An initial Jacobian matrix relates changes in the prototypes design variable physical features to changes in the prototype performance characteristics. The prototype is tested to determine the error between the specifications and the prototype performance characteristics. The initial Jacobian is applied to this error to generate a change order signal for the physical features. This change signal is input to a prototyping apparatus, preferably automatic and rapid, which physically changes the prototype. The prototype is again tested for satisfaction of the specifications. If necessary, the prototype is changed again and again. The Jacobian, can be automatically changed by comparing the change in performance from one prototype to the next prototype, with the change made in physical features and applying a recursive least squares method to recursively change the Jacobian. The prototype and the Jacobian automatically converge to accurate versions of each. An apparatus includes a prototype fabrication unit, an experimentation unit, and a design feature change calculation unit, which also includes a Jacobian adjustment unit. Systematic, automatic design of complex physical structures is accomplished, without the need for a precise initial prototype or understanding of the relationship between the physical features and the performance characteristics.

24 Claims, 7 Drawing Sheets

OTHER PUBLICATIONS

Garcia, E., and Inman, D. J., "Advantages of Slewing an Active Structure," *Journal of Intelligent Materials Systems and Structures*, vol. 1, pp. 261–272, Technomic Publishing Co., Inc. (Jul. 1990).

Ikegami, R., Wilson, D. G., Anderson, J. R. and Julien, G. J., Active Vibration Control Using NiTiNOL and Piezoelectric Ceramics, *Journal of Intelligent Materials Systems and Structures*, vol. 1, pp. 189–205, Technomic Publishing Co., Inc. (Apr. 1990).

Weiss, L. E., Gursoz, E. L., Prinz, F. B, Mahalingham, S., Fussel, P. S., "Rapid Prototyping of Tools: Technical report," Carnegie–Mellon University, Pittsburgh, PA. Robotics Institute (1989) (Abstract Only).

Renault, T., Ogale, A. A., Dooley, R. L., Bagchi, A., Jara–Almonte, C.C., "Photolithography for composites manufacturing. Continuous glass fiber/polyacrylate composites," *SAMQA2 Quarterly*, vol. 22 n. 2, pp. 19–25 (Jan. 1991) (Abstract Only).

Jara–Almonte, C. C., Bagchi, A., Ogale, A. A., Dooley, R. L., "Design environment for rapid prototyping," Issues in Design/Manufacture Integration, ASME, Design Engineering Division DE v. 29 New York, pp. 31–36 (1990) (Abstract Only).

Choi, Y., Weiss, L, Gursoz, E. L., Prinz, F. B., "Rapid prototyping from 3D scanned data through automatic surface and solid generation," Issues in Design/Manufacture Integration, ASME, Design Engineering Division DE v. 29 New York, pp. 17–23 (1990) (Abstract.

Decker, C., "Kinetic analysis of laser–induced reactions in polymer films," Proceedings of *SPIE—The International Society for Optical Engineering* v. 1279, pp. 50–59, Bellingham, WA (1990) (Abstract Only).

Wood, L., "Rapid prototyping. Uphill, but moving," *Manufacturing Systems* v. 8, n. 12, pp. 14–16 (Dec. 1990).

Cromwell, W. E., "Prototype casting fabrication by stereolighography," Department of Energy Reports, No.: KCP–613–4427; Conf–9010279–1; Conf 9010280–1; Conf–9010281–1 (1990).

METHOD AND APPARATUS FOR THE RECURSIVE DESIGN OF PHYSICAL STRUCTURES

BACKGROUND

This invention relates generally to the design of physical structures to satisfy task specifications of product characteristics. It relates more specifically to a method and apparatus for designing such structures, e.g., mechanical systems, where prototyping of the physical system provides advantages. The invention also relates to such a method that can be systematized and automated, requiring minimal human operator intervention.

Traditionally, the process of developing physical systems, such as machines, robots and electro-mechanical systems, includes an initial design phase 102, a prototyping phase 104, and a phase 108 of testing the prototype(s), as shown in FIG. 1.

In product design, the designer has a set of specified product performance characteristics goals. The goals may generally relate to the dynamic performance of the product, such as its natural frequencies, mode shapes, system poles and zeroes, damping, etc. Product performance characteristic goals can also include static properties, such as the mass, inertia, length or other dimensional or comformational properties.

The designer must design a physical product that satisfies the product characteristic goals as closely as possible. To do so, the designer fabricates a physical item. The physical item may be defined by certain physical features, such as its geometry, density, mass, stiffness, surface roughness, etc.

A product having one set of physical features will exhibit a certain set of product performance characteristics. A product having a different set of physical features will exhibit a different set of product performance features. For instance, the natural frequencies and mass may differ.

Because the physical features may be chosen by the designer, these are referred to in this specification and the appended claims as "design variable physical features," or simply as "design features." In some cases, an aspect of a product may be included in both the product characteristics and the design features. For instance, a robot arm link may have as a specified product characteristic a specific length. Length is also one of the typical features the designer may use to achieve specified, also referred to as goal, product characteristics. Thus, in some instances a generic aspect may be considered to be a product characteristic and in other instance, the same aspect may be considered a design variable physical feature.

The output of the design phase 102 is a physical item based on the designer's understanding of the target or specified product characteristics, the physical laws that govern the type of product or system under design, the mechanical properties of materials, etc. Based on an estimate of these factors, the designer develops a tentative theoretical structure, and then, in the prototyping phase builds a physical prototype to implement the theoretical structure. In some cases, the designer may construct a computer model of the tentative theoretical structure and test the model by computer, before actually building a physical prototype. Typically, however, a physical prototype is eventually made.

During the testing phase 108, the physical prototype is subjected to conditions, designed to be either identical to or similar in pertinent respects, to the working environment of the target system. The performance of the prototype is noted, and compared to the specified product characteristics. In some cases, the prototype satisfies the specifications. In many cases, however, it does not and it is necessary for the designer to modify the tentative theoretical design so that a new prototype can be made. If the design task is not complicated and the designer has sufficient understanding of the underlying conditions set forth above, it may be possible to alter the tentative design with certainty that the altered design will satisfy the specified product characteristics.

Often, however, the system is too complex to model relative to the designer's understanding, and there will be no certainty. For example, in the design of a high speed robot, exact dynamic behavior is difficult to predict (See generally, Park, J. and Asada, H., "Integrated Structure/Control Design of a Two-Link Nonrigid Robot Arm for High Speed Positioning," Proc. of the 1992 IEEE Intl. Conf. on Robotics and Automation.) The relationship between design variable physical features of the physical item being fabricated, such as link geometry, mass, and stiffness and the performance related product characteristics, such as natural frequencies, mode shapes, damping, and system poles and zeros is intricate. Due to the uncertainty and difficulty in computer modeling, inappropriate mechanical constructions may result, which limit the product's performance, and consequently require substantial changes to meet the product characteristics specifications.

Repeated prototyping and experimentation are then indispensable steps in order to cope with the uncertain and unpredictable behavior of the system. Rather than making a number of prototypes sequentially, it is also common to make a number of different prototypes initially and simply choose among them.

As shown in FIG. 2, when the discrepancy Δs between the specified product characteristics and the prototype product characteristics, as determined at the evaluation phase 201, is large, experimental results must be fed back to the design stage 202 in order to reduce the difference. The apparatus is redesigned, and a new prototype is built 204 and tested 206. If the performance discrepancy Δs due to this revised design is still significant, design 202, prototype fabrication 204 and experimentation 206 steps may again be required. It is, however, difficult to use the experimental results in a second, or subsequent design phase 202. Design changes and prototype fabrication as well as experimentation are costly in both time and money, and repeating the whole sequence of steps is a lengthy process.

Another problem with returning to the prototype phase 204 is that it is often very difficult to know how to design the next version of the prototype. The designer reviews the data from as many tests as are available, and from that, must decide which of the physical features to change and by how much. Much of this phase is akin to an art, rather than a science, drawing on the designer's experience and intuition. In short, the design process is not very systematic or programmatic. A designer facing a large Δs has many options available for change, but little direction as to which option to choose.

As is evident, the design then prototype then redesign process requires substantial input from the human designer at every step of the process. The designer must establish the first prototype; he must develop a set of relations between the design variable physical features and the product characteristics, if the initial prototype fails to meet the specified product characteristics, and, he must decide how the subsequent prototype should be designed, in light of the shortcomings of the previous one(s) and the set of relations mentioned above. All of these tasks require human action and attention, not to mention the expenditure of significant cognitive energy.

Consequently, the path from design 202 to experimentation 206 and back again is typically traversed only a few times at most. The result is that further performance improvement is often abandoned due to cost and time limits.

Thus, there exists a need for a method by which the designer can make a tentative design, implement the design in a physical prototype, test the design, and take account of the tests in one or more redesigns, which is fast enough so that it can be used in commercial product design. Similarly, there is a need for such a method which is not prohibitively expensive. A related need exists for an apparatus that can be used with the methods identified above, for instance to make incremental changes to a physical prototype, so that the performance of the changing prototype can be tested for its satisfaction of the product characteristic design specifications. There is also a need to provide a systematic method for design of a prototype, so that the design predictably converges toward a successful model. A need also exists for a method and apparatus so that such a design can be conducted automatically after initial user inputs, such as an initial prototype and initial estimates for the relation between the design variable physical features and the product characteristics. There is also a need for an apparatus to automatically conduct such design steps. Another need is for an apparatus that will automatically implement prototype changes into a physical prototype. There is also a need for a method of product design that uses an initial prototype that does not satisfy the product characteristics specifications very well, but which automatically converges on the specifications.

SUMMARY

The invention includes a method and an apparatus for automatically fabricating a physical prototype. An initial prototype is created, which need not satisfy the specified performance characteristics. An initial Jacobian matrix is established to relate changes in the prototypes design variable physical features to changes in the prototype performance characteristics. The prototype is tested to determine the error between the specifications and the prototype performance characteristics. The initial Jacobian is applied to this error to generate a change order signal for the physical features. This change signal is input to a prototyping apparatus, preferably automatic and preferably rapid, which makes the physical changes to the prototype. The prototype is again tested for satisfaction of the specifications. If necessary, the prototype is changed again and again.

It is also beneficial to automatically change the Jacobian. This is accomplished by comparing the actual change in performance from one prototype to the next prototype, with the actual change made in physical features and applying a recursive least squares method to recursively change the Jacobian. Thus, the prototype and the Jacobian automatically converge to accurate versions of each. An apparatus is also disclosed that includes a prototype fabrication unit, an experimentation unit, and a design feature change calculation unit. The latter also includes a Jacobian adjustment unit. The method and the apparatus allow the systematic, automatic design of complex physical structures, without the need for a precise initial prototype or understanding of the relationship between the physical features and the performance characteristics.

More specifically an aspect of the invention is a method for the design of a product. An initial prototype is provided and tested for satisfaction of specified product characteristics. The results of the tests are used to automatically generate a set of changes to be made to features of the structure of the prototype. The set of feature changes are automatically applied, such as under the control of a programmed computer or dedicated processor, to change the structure of the prototype. The steps of testing, change generating and prototype changing are repeated until the prototype satisfies the specified product characteristics.

Another preferred version of the invention is a method for the design of a product having prototype values of product characteristics to be within an acceptable tolerance from specified values of the product characteristics. An initial physical prototype is provided, which is described by design variable physical features. An initial Jacobian J, is also provided, which relates changes in the values of the design variable physical features to changes in the prototype values. The prototype is tested and a signal is generated representing the prototype values. A signal representing the specified values is also generated, as is a product characteristics error signal, representing the difference between the prototype values and corresponding of said specified values. If the difference represented by the error signal is not within the acceptable tolerance, additional steps are repeatedly performed until the difference is within the acceptable tolerance. The additional steps include applying the Jacobian to the error signal to generate a change signal representing change amounts to be made to the values of the design variable physical features. The prototype is physically changed so that the values of said design variable physical features change by said amounts. The changed prototype is tested to determine the present prototype values and a signal representing the present prototype values is generated. A product characteristics error signal is generated, representing the difference between the prototype values and corresponding of the specified values. The difference is evaluated, and the process stops when the difference is within an acceptable level of tolerance.

The method of the invention may also include, after said step of evaluating the error signal, additional repeated steps. A prototype characteristics difference signal is generated, representing the difference between the present prototype values and the values before the most recent change to the prototype. The prototype characteristics difference signal is related to the change signal to determine whether the Jacobian requires alteration and, if it does, the Jacobian is altered. All of the steps are preferably automated, so that after the initial prototype and Jacobian and specifications are provided, the process proceeds automatically. The automation may be effected using a general purpose computer, or dedicated processors.

Another preferred embodiment of the invention is an apparatus for automatically producing an article, having prototype values of product characteristics to be within an acceptable tolerance from specified values of the product characteristics, the article being described by design variable physical features. The apparatus includes a means for measuring the characteristic values of a physical prototype. Means are also provided for comparing the prototype characteristic values to the specified values to generate a product characteristics error signal. The error signal is input to a means for applying a Jacobian, which relates changes in the values of product characteristics to changes in the values of design features. The desired change in the values of the product characteristics is the error signal. The Jacobian application means generates a change signal, which is input to a means for making physical changes to the prototype based on the change signal.

The invention may also include a means for adjusting the Jacobian, which, in a preferred embodiment includes means for comparing the product characteristic values for a first version of a prototype, to the product characteristic values for the version of a prototype immediately preceding the last change to the prototype, to generate a prototype characteristics difference signal. A means is provided for relating the change x signal to the prototype characteristics difference signal. Further means are provided for using said relation to change said Jacobian.

In a preferred embodiment, the apparatus includes a computer to automate all of its processes. The changes to the prototype are typically conducted in a rapid prototyping unit, such as a photo polymer unit. For instance, additional layers of coating can be applied. The computer controls the measurement of each successive prototype, the changes to the Jacobian and the calculation of the amount of changes to be made to the prototype. It also controls the prototyping apparatus, to change the product as desired.

BRIEF DESCRIPTION OF THE DRAWINGS

These and other features, aspects, and advantages of the present invention will become better understood with regard to the following description, appended claims and accompanying drawings, where:

DETAILED DESCRIPTION

Figure 1:
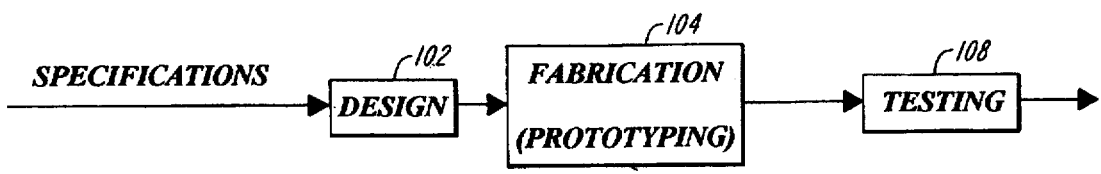
FIG. 1 is a schematic, block diagram view of the prior art product development steps of design, prototype and test.
Figure 2:
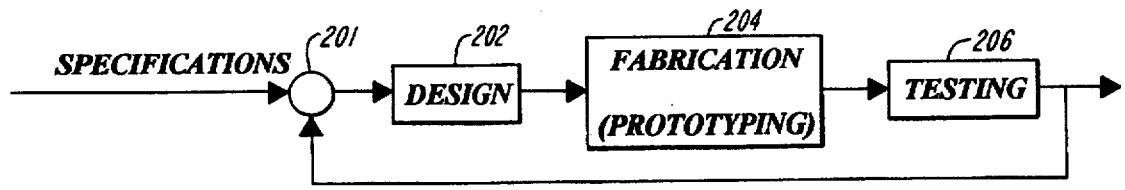
FIG. 2 is a schematic, block diagram view of the prior art product development steps of design, prototype, test and redesign.

The invention includes a method of recursive prototyping and design modification that applies system feedback control methods to control the changes from one prototype to the next in the recursive process. This permits fulfilling the desired specifications rapidly and efficiently despite uncertainties in the design and modeling stage and the unpredictable nature of system behavior. It also provides a systematic way for the design to converge on an acceptable donfiguration, which can be highly automated, if desired. Thus, the recursive design, prototype, test, redesign, etc. method of design illustrated schematically in FIG. 2 is enhanced by regarding it as a system to be controlled with a feedback loop from test to design. The invention also includes, as another aspect, an apparatus for implementing the invention.

Figure 5:
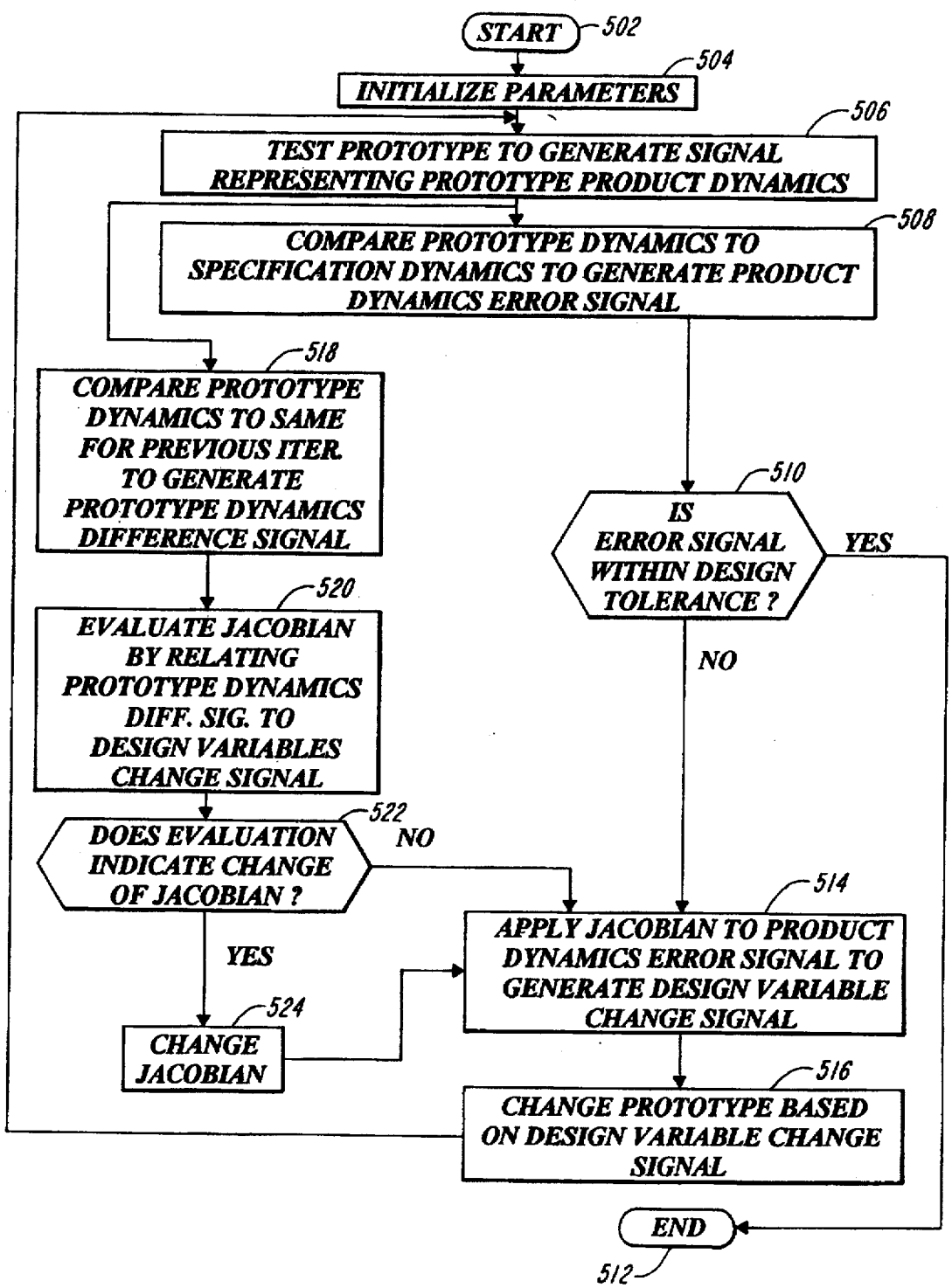
FIG. 5 shows in flowchart form the steps of a version of the method of the invention.

A schematic illustration of the steps of a version of the method of the invention is shown in flowchart form in FIG. 5. The method begins 502 and the operator initializes parameters 504. The parameters to be initialized include the product characteristic specifications sought to be achieved, (which is essentially a list of parameters L, and values r for those parameters) the initial form of the physical prototype (which is a physical object, such as a robot arm) and an initial estimate for the values of a matrix referred to below as a "Jacobian" matrix.

The matrix values and its configuration relate the design variable physical features of the prototype, to the product characteristics that have been specified, such as natural frequencies, mode shapes, damping, system zeroes, mass, strength, frequency characteristics, etc. The design features include the shape and dimension of the prototype, and other physical aspects of a similar character that a designer can change independently. The possible variable design features form a set D, which, like L, is simply a list of features. A vector X is composed of the values for the features L, which describe a particular prototype.

As will be seen below, the method results in a redesign of the prototype, which redesign causes successive prototypes to converge upon a configuration having the desired characteristics. Therefore, the designer need not spend significant resources making sure that the initial prototype is as refined as it can be. Therefore, the physical prototyping process may be initiated more quickly than in the conventional case.

After the initialization step 504, the physical prototype is tested 506 to generate a set of values for the prototype product characteristics. The prototype is tested for its performance with respect to the same characteristics as are specified in the product characteristics specifications. The results of the test are compared 508 to the product characteristics specifications and the result is used to determine 510 if the prototype satisfies the specifications within an acceptable tolerance. If the prototype is within tolerance, the process ends 512, and the prototype product characteristics become the product characteristics for the finished product. Similarly, the values then established for the design features become the values for the physical features of the successful prototype.

If the prototype is not within tolerance, which is typically the case, the next step of the method is to apply 514 the Jacobian matrix to the product characteristics error signal between the specified product characteristics and the prototype product characteristics. The output of this step will be a set of changes of the design features, which define the shape and other physical features of the prototype. These changes will be used to change 516 the prototype, in such a way that its performance will better satisfy the product characteristic specifications.

The prototype is changed by using an appropriate prototyping technique, such as are discussed in more detail below. It is typically beneficial if the prototyping method is rapid or automatable or both. By "rapid prototyping" technique, it is meant any technique that changes the design variable physical features of the prototype quickly enough so that a new version of the prototype can be tested shortly thereafter. By "automatable," it is meant that data representing the design features can be stored in a form of machine memory, and the data values for the design features can be directly converted to a physical apparatus or structure by means of a physical fabrication apparatus, such as what are commonly referred to as computer numerically controlled ("CNC") apparatus.

The prototyping technique referred to herein is typically a rapid prototyping method, such as a fast setting plastic coating method. However, all that is required is that the prototyping method be quick enough so that it is cost effective to use it in conjunction with the automatable feature of the invention. The prototyping may take a long time, but, compared to a normal way of accomplishing the prototyping task, the invention converges more efficiently on the desired results.

The method of prototype design returns to the step of testing the prototype 506 again, to generate a subsequent set of prototype product characteristics. The resultant prototype product characteristics 508 are again compared 508 to the specified product characteristics, and the error signal between the two is again evaluated 510 to determine if it is within tolerance. If the error is within tolerance, the process ends 512. If the error is not within tolerance, the method proceeds to the step of applying 514 the Jacobian to determine how to change the prototype again.

As is mentioned above, it is difficult to obtain a precise Jacobian, due to the complexities of typical mechanical systems for which the method would be applied. Therefore, it is beneficial to recursively adjust the Jacobian as the prototype is being altered, using the data obtained while repeatedly testing and changing the prototype. After the Jacobian is applied 514, the steps of changing the Jacobian are conducted by using new data obtained from the experimental test (evaluation) for the altered prototype.

After the prototype is tested 506 to generate a set of values for the prototype product characteristics, the difference is taken 518 between the values for the present set of prototype product characteristics and the values for the set attributable to the conformation of the prototype of the previous round, i.e., before its most recent rapid prototype change. This prototype product characteristic difference signal is used in combination with the set of physical changes by which the prototype was modified between the taking of the two sets of prototype product characteristics to evaluate 520 the accuracy of the Jacobian. A step to determine whether it is appropriate to change the Jacobian is conducted 522, and if it is, the Jacobian is changed 524 as discussed in detail below. If it is not appropriate to change the Jacobian, it is not changed, and the Jacobian is applied 514, unchanged from the previous application.

Eventually, the steps of the method of the invention lead to the fabrication of a prototype that is within tolerance of the product characteristic specifications, and the process ends 512.

Figure 3:
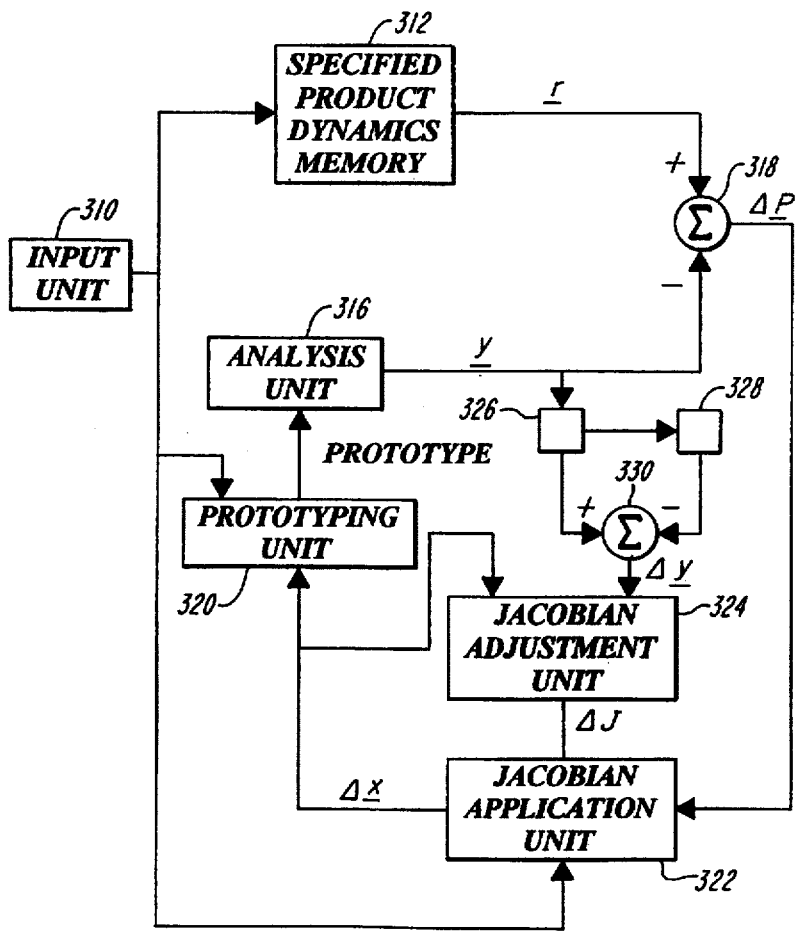
FIG. 3 is a schematic block diagram overall view of an embodiment of the apparatus of the invention, showing a stage for fabricating a prototype, a stage for comparing the performance of the prototype to a reference model of specified product characteristics and a stage for recursively developing a relationship between physical changes in the prototype and its satisfaction of the specified product characteristics.

A schematic illustration of components of a version of the apparatus of the invention is shown in FIG. 3. The designer provides input through a user input unit 310. The inputs include the product characteristic specifications, as discussed above, sometimes referred to as a reference model, which are maintained in a product characteristics specifications memory 312. Another user input is a first version of a product prototype, which is established in prototyping unit 320. Additional user inputs include the types of conditions used to test the prototype, such as sine waves, etc. The product characteristics specifications are not embodied in a physical entity, constituting rather simply a list L of the pertinent characteristics and values r for each pertinent characteristic. (As used herein and the appended claims, an underbar indicates a vector.) The list of product specifications, such as "natural frequency," "mode shape," "damping," etc. is referred to below as a set L of items. The values for members of the set, i.e., the specified product characteristics, are organized in a set "r."

The physical prototype characteristics are described by the same set of product characteristics L as the product specification characteristics, however many of the values will differ, at least initially from the values r for the specifications. The values for the members of the set L of product characteristics for the physical prototype are organized in a set "y."

Because the prototype is a physical apparatus, the values y of its product characteristics L must be measured or otherwise determined by analysis from physical inspection of the prototype and its environment. This is conducted by a prototype analysis unit 316. The analysis unit consists of appropriate sensors, such as strain gauges, accelerometers, motion detectors, thermocouples, flow sensors, microphones, etc., selected to provide a full complement of signals, representing each of the product characteristics in question. There may also be a data processing unit included as part of the prototype analysis unit, to generate signals representing characteristics that are based on a combination of other parameters.

A comparator 318 compares signals representing the values r for the specified product characteristics with the signals representing the values Y for corresponding physical prototype product characteristics and generates a product characteristics error signal $\Delta s$. According to the present invention, the physical structure of the prototype is in fact altered to achieve correspondence between the specified product characteristics r and the physical prototype product characteristic values y. This takes place in an appropriate prototyping unit 320, such as a rapid prototyping unit (one embodiment of which is described in more detail below). As the physical design is modified recursively, the values of the physical prototype product characteristics converge to the desired product characteristic specifications. By using feedback control techniques, the physical adaptation process is driven to a desired end more effectively and rigorously than by empirical and intuitive methods.

The nature of the prototyping unit 320 depends on the type of product being designed. For instance, three-dimensional printing or product build-up using quick-acting photo-polymers can be used for rapid prototyping. More traditional fast forming media, such as quick-set plastics and cements may also be used. Micro-manufacturing may also be a part of the rapid prototyping. Conventional prototyping methods may also be used, if they lend themselves to being automated and the time required is cost effective for the particular project under consideration.

The type of prototyping depends on the sizes and other parameters of the end product. In other words, it may not be necessary that the prototype be an exact duplicate of the product that will ultimately be produced. For instance, if shape alone matters, a plastic may be used to prototype a part that will be metal, without regard to its strength or many other properties. If strength is an important design parameter, then the prototyping should be done using a material that approximates the strength properties of the material to be used in the finished product. Persons of ordinary skill in the art will understand the requirements of prototype choice. A representative rapid prototyping unit is discussed in detail below.

The Jacobian is applied at a Jacobian application unit 322 to the error signal $\Delta s$ to produce a design feature change signal $\Delta x$ that indicates the design feature changes that should be made to the physical prototype to reduce the error signal $\Delta s$ between the specified product characteristics and the values of the prototype product characteristics.

As mentioned above, generating the relationship embodied in the sensitivity Jacobian is sometimes difficult, and benefits itself from a recursive estimation. Initially, an estimate for the Jacobian is made based on the designer's understanding of the physical aspects of the apparatus and perhaps a model. If the Jacobian is perfect, then the version of the prototype after a single revision will be identical to the specified product, having matching characteristics. Typically, however, the Jacobian is not perfect and additional prototypes must be made.

A Jacobian adjustment unit 324 compares the change $\Delta y$ in the values of the prototype product characteristics y, for a given change $\Delta x$ in the prototype's design variable physical features x. The values $Y_{[t]}$ for the product characteristics from a given prototype are passed to memory 326. After a test of that prototype, changes $\Delta x$ to be made in the design feature values x are determined by Jacobian application unit 322. Signals representing these changes $\Delta x$ are used to control the prototyping unit 320 and to change the physical prototype in the rapid prototyping unit 320. The prototype is again tested, and a new set of prototype product characteristics $Y_{[t]}$ is measured. The old set $Y_{[O]}$ is moved from store 326 to store 328 and the new set of prototype product characteristics $Y_{[t]}$ is placed in store 326. These two sets of prototype product characteristics y are compared by comparator 330 to generate a prototype characteristics difference signal $\Delta y$ relating to the change in y from one prototype embodiment to the next. The change in the various y characteristic values within a set are correlated to the change in the values x of the design features through the same recursive cycle in the Jacobian adjustment unit 324. These comparisons are used to adjust the sensitivity Jacobian 322 for the next recursive run through the apparatus.

Figure 4A:
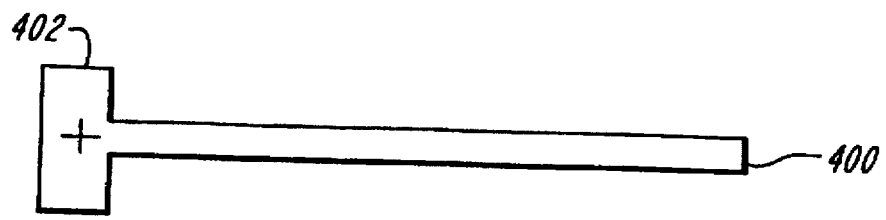
FIG. 4A, 4B, 4C and 4D show schematically a simplified example of how a series of structural modifications may be made to the physical features of a prototype by a recursive evaluation technique.
Figure 4B:
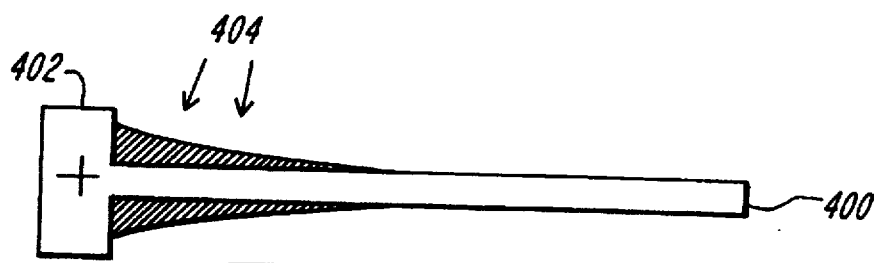
Figure 4C:
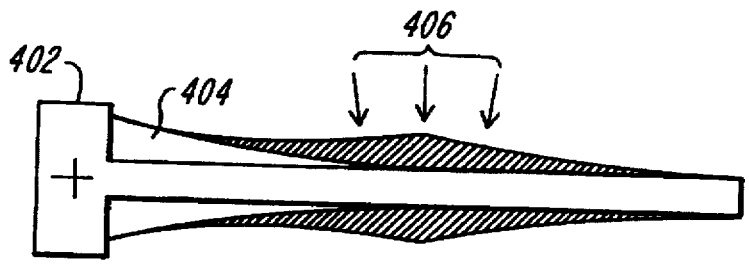
Figure 4D:
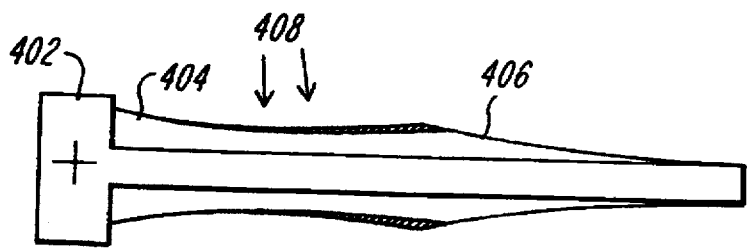

Before presenting a detailed analysis of how the various parameters are related to each other and generated, an overview of the change in structure of a subject prototype will be illustrated. The changes will be discussed with reference to both FIGS. 5 and 3. FIG. 4A shows schematically a single link 400 of a robot arm. The original structure, as shown in FIG. 4A, is a straight beam having a uniform rectangular cross-section along its length. By conducting experiments on the original link 400, the values of the prototype product characteristics which give rise to its dynamic response, are determined. A sensitivity Jacobian is also determined, to relate the change in such a prototype product characteristic value, compared to the change in a design variable physical feature of the arm, such as its cross-section near to the base 402. Based on the discrepancy $\Delta s$ between the specified product characteristics r and the measured prototype product characteristics y, and the Jacobian, a change is made in one or more of the design variable physical features of the physical prototype, such as the cross-section in a segment of the arm 404 near to the base 402. As shown in FIG. 4B, the cross-section of the arm is increased at this region 404.

A convenient way to increase the cross-section of the arm is to apply a quick setting coating to the portions of the arm that require increased cross-section. Coating may be added by using a photo-setting polymer; a fast setting plaster or cement; a sprayed or sputtered metal film, etc.

For the modified structure, the measurement experiments are again conducted by use of the analysis unit 316, and signals representing the values for the modified prototype product characteristics y are compared at the comparator 318 with signals representing the specified product characteristic values r, to generate the product characteristics error signal $\Delta s$.

After the product characteristics y are taken, the sensitivity Jacobean is altered to eliminate or reduce $\Delta s$ after the next iteration, due to a comparison between signals representing the change $\Delta y$ in the prototype product characteristics y from one iteration to the next resulting from a change $\Delta x$ in the values of the design variable physical features of the arm and the product characteristics signal $\Delta s$ and the product specification characteristics r. This makes the sensitivity Jacobean more accurate. The revised sensitivity Jacobean is applied to the product characteristics error signal $\Delta s$, and a design features difference signal $\Delta x$ for the physical features D is generated, which is used by rapid prototyping module 320 to again alter the physical prototype. For instance, the various changes may indicate that adding additional material along the mid length region 406 will bring the prototype product characteristic values y into closer registration with the corresponding specification product characteristic values r, thus further reducing the product characteristics error signal $\Delta s$.

After this change is made to the prototype, the product characteristics error difference signal $\Delta s$ is again measured; the Jacobian is again adjusted and is again applied to the product characteristics error signal $\Delta s$ to generate a design variable change signal $\Delta x$, which may indicate adding material at a region 408 intermediate the mid-length region 406 and the region 404 that is closest to the base 402.

The foregoing example uses a reinforced coating method of changing the values of the design variable physical features x of the apparatus under design. Other methods of changing the design features can be used, either separately or in combination with a coating method. For instance, material may be added in different ways, such as by welding, soldering or adhesives of varying duration. Conversely, material may be removed, such as by grinding, polishing, chemical removal, cutting, burning, etc. Mass distribution may be changed by altering the nature of materials contained within hollow bodies. Similarly, internal damping may be changed by this or other methods. Surface properties can be changed by grinding, polishing, roughening, etc. The invention is general and may be implemented using any suitable technique to change the physical aspects of the prototype. However, for purposes of illustration in this specification, the method of changing the prototype by adding a coating will be used.

Similarly, the method may be applied to any mechanical, or electro-mechanical apparatus or system of apparati. However, for purposes of explanation and simplification, the example of a single link arm, as illustrated in FIG. 4, such as used in a pick-and-place robot, is used.

Modifying the physical prototype based on the difference signal Δs

Central to the invention is the method and apparatus for modifying the characteristics of the physical prototype based on the error Δs between the values r specified for the product characteristics and the values y measured for the prototype product characteristics. The method used to modify the prototype is basically the gradient descent method for minimizing a squared error function through recursive operations. However, other methods for minimizing a difference signal between two signals are within the scope of the invention. Such methods include but are not limited to: Newton's algorithm and the pseudo inverse method.

The physical prototype may be characterized by m product characteristic values y, organized as a vector (indicated by the underbar) $Y=[Y1,\ldots,Ym]^T$, the values of which are determined based on experiments performed on the prototype. The product characteristic specifications r are described by a vector $r=[r_1,\ldots,r_m]^T$, where corresponding members of r and y (i.e., having the same subscript), relate to the same member of the set of product characteristics L, such as fundamental natural frequency, total weight, etc. The overall squared error E is given by:

$$E=(y-r)^T Q(y-r), \quad (1)$$

where Q is an m by m weighting matrix, the weight being determined based on the importance of the particular product characteristics. The objective is to minimize the squared error, E, by modifying the physical structure of the prototype.

The physical features of the prototype are described by a vector x of n members, $x=[x_1,\ldots,x_n]^T$. As mentioned above, the design features x may be dimensions or coordinates of the structure, parameterizing the prototype. The product characteristic values y, of the prototype, are dependent on the values of the prototype design features x. It is assumed, for purposes of the method, that the functions relating y to the values x are differentiable.

(This is a reasonable assumption for the small changes that are under examination at each step of the method.) The object of the method is to obtain optimal structure changes reflected in the values x of the design variables, that minimize the squared error E. The method is recursive by making incremental changes in the structure variables.

Using the gradient descent method, the vector of design features changes Δx is given by:

$$\Delta \underline{x} = -\rho \left( \frac{\partial E}{\partial \underline{x}} \right)^T = 2\rho \underline{J} Q(r-y), \quad (2)$$

where ρ is a proportionality constant that determines the step size of the change in the value x of a design feature D, for insance, the step increase in coating thickness for one iteration. J is the m by n sensitivity Jacobian Matrix given by $$\underline{J} = \begin{bmatrix} \frac{\partial y_1}{\partial x_1}, & \cdots & \frac{\partial y_1}{\partial x_n} \\ \cdot & & \cdot \\ \cdot & & \cdot \\ \cdot & & \cdot \\ \frac{\partial y_m}{\partial x_1}, & \cdots & \frac{\partial y_m}{\partial x_n} \end{bmatrix}. \quad (3)$$

The invention is used to determine the structure changes to be made, for instance, by adding reinforcement coatings along the prototype beam's length to modify the prototype's characteristics y as illustrated in FIG. 4. The value x of the physical design features, D, in this case represent the thickness of the coated structure at different locations, and the incremental change, Δx, represents the distribution of coating thickness at each iteration. To discretize the thickness distribution, the structure is divided into n segments along the length of the prototype beam, the thickness of which is represented by the variables $x_1$ through $x_n$.

The characteristics of the prototype apparatus as well as the specified reference model may be characterized by frequency responses, specifically, the magnitudes of the transfer functions of the product under consideration. The frequency transfer functions of the physical prototype and the specified reference model, are defined as $G_y(jw)$ and $G_r(jw)$ respectively. It is convenient to also discretize the transfer functions, which can be done by evaluating them at a set of specific frequencies, $w_1$ through $w_m$. The prototype characteristics at these frequencies are given by:

$$Y=[log|G_y(jw_1)|,\ldots,log|G_y(jw_m)|]^T \quad (4)$$

Similarly, for the specified reference model, the desired characteristics are given by:

$$r=[log|G_r(jw_1)|,\ldots,log|G_r(jw_m)|]^T. \quad (5)$$

The sensitivity Jacobian, J, substituting the value for Y from Eq. 4 into Eq. 3 is given by:

$$\vec{J} = \begin{bmatrix} \frac{\partial log|G_y(jw_1)|}{\partial x_1}, & \cdots & \frac{\partial log|G_y(jw_1)|}{\partial x_n} \\ \cdot & & \cdot \\ \cdot & & \cdot \\ \cdot & & \cdot \\ \frac{\partial log|G_y(jw_m)|}{\partial x_1}, & \cdots & \frac{\partial log|G_y(jw_m)|}{\partial x_n} \end{bmatrix}, \quad (6)$$

where each element accounts for the sensitivity of the transfer function magnitude at a particular frequency to an infinitesimal thickness change at a particular segment along the length of the structure. For instance, $$\frac{\partial log|G_y(jw_1)|}{\partial x_1},$$

the element in the first row and first column of J, represents the change in the transfer function at a first frequency, $w_1$, with respect to a change in the thickness at a certain location along the length of the arm, for instance the region 404 closest to the base 402. The second element in the first column, $$\frac{\partial log|G_y(jw_2)|}{\partial x_1}$$

represents the change in the transfer function at a second frequency, $w_2$, with respect to a change in the thickness at the same location, i.e. the region 404 closest to the base 402. The first element in the second column, $$\frac{\partial \log|G_y(jw_1)|}{\partial x_2}$$

represents the change in the transfer function at the first frequency, $w_1$, with respect to a change in the thickness at a different location, e.g., the region 408, next to the region 404, which is itself closest to the base 402. The remaining elements in the Jacobian fill out the remaining relations among the transfer function frequencies and the physical parameters, in this case, thickness at certain locations.

It is not necessary to use the transfer function at discrete frequencies. Rather, it is possible to use a continuous representation of the function that relates the design variable physical aspects to the product characteristics. Alternatively, rather than the transfer function, other parameters could be used for the compared specified and prototype product characteristics, such as fundamental natural frequency, mass, physical dimensions, etc. Similarly, additional design features, D, of the prototype could be used, rather than just thickness at certain locations. Mass distribution, moment of inertia, density, etc., either alone or in combination may be used.

An important aspect to use of the invention is the determination of the sensitivity Jacobian J. Because mathematical models of the physical prototype and its environment may not be accurate, particularly with respect to damping, the Jacobian cannot be computed simply by using a mathematical model. A version of the invention uses a recursive experimental technique and apparatus to determine the sensitivity Jacobian, as has been indicated above.

Determining the Sensitivity Jacobian

There are several methods by which the sensitivity Jacobian can be determined. Included among these are: an experimental method; a model-based computational method; a Kalman filter and a hybrid experimental and model-based method using a recursive least squares technique.

An Experimental Method of Determining the Sensitivity Jacobian

One method for identifying the Jacobian is totally experimental. Although this method is time-consuming, it allows identifying the Jacobian with minimal knowledge of the physical prototype and its environment. Namely, each element of the Jacobian matrix is determined by examining the effect on the prototype product characteristics y of an actual physical change $\Delta x$ in the design features of the prototype. When a method such as the coating method for altering the prototype structure is used, the physical change can be made by placing a coating on one segment of the structure.

First, experiments are conducted on the original prototype with no coating and the system characteristics, $Y_{[0]}$, are evaluated. Next, a small change $\Delta$ is made in one of the design feature values, i.e. $x_1$, by physically modifying the prototype structure, and then experiments are conducted on the new modified prototype structure to evaluate the set of new prototype product characteristics, $y_{[1]}$. The i-th column (relating the change in each of the prototype product characteristics to a change in a single physical design feature $x_i$) of the sensitivity Jacobian, $J_i$, is then determined by:

$$J_i = \left( \frac{y_{[1]} - y_{[0]}}{\Delta x_i} \right). \tag{7}$$

After one design feature has been changed throughout its entire range, or a representative portion thereof, the changes are reversed so that the prototype is again in its original condition. For instance, coating is applied again and again to the same region of the arm. After the maximum amount of coating has been added, it is all removed and is then added to the next portion of the arm. This experimentation process can be repeated for all physical design features of the prototype $1 \leq i \leq n$, to determine all of the columns of the sensitivity Jacobian.

A Model Based Method of Determining the Sensitivity Jacobian

The fully experimental method may be time consuming and costly, as the number of design variable features x of the physical prototype increases. A possible alternative is to obtain the Jacobian computationally, such as from a finite element model or any theoretical model of the structure. However, such mathematical models are limited in accuracy due to unmodeled characteristics, such as damping. It is well known that damping is very difficult to estimate theoretically. The process of determining the sensitivity Jacobian can be accelerated substantially, particularly for obtaining a quick estimate of the matrix. The quick estimate can be used as a starting point for the recursive method of the invention, thus avoiding the difficulty of the fully experimental method.

If the model is provided in a closed-form equation in which physical design features D of the prototype are involved explicitly, then the sensitivity Jacobian can be obtained directly by taking partial derivatives of the equations. Such a closed-form model, however, is seldom available. It may be necessary to take derivatives numerically by making small changes in the values, x. Two computations are made using an FEM: one with x and the next with $x+\Delta x$. The corresponding y and $y+\Delta y$. Similar to the experimental method, the behavior of the modified model structures are then evaluated and the quotients given by Eq. 7 are taken to provide the relationship. Next, the evaluation is performed numerically without making physical changes in the actual structure.

A Hybrid Method of Determining the Sensitivity Jacobian, Using a Recursive Least-Squares Technique The disadvantage of the model-based computational method is that models typically cannot capture complex effects in the real physical structure. Of primary concern is the difficulty in modeling damping effects (of both the original structure and the reinforcement material, if the reinforcement coating technique is employed). However, the computational method is useful for obtaining an initial estimate of the Jacobian. Conversely, the purely experimental method may not be applicable to a complex structure with many elements. Yet, it does provide valuable information concerning the actual physical apparatus.

A hybrid of the experimental and computational methods may be used in order to combine the advantages of the two. Briefly, a computational method is used to obtain an initial estimate of the sensitivity Jacobian, $J_{[0]}$. This initial estimate is then modified by using experimental data acquired from the recursive prototype design and re-design process. As has been explained above in connection with FIGS. 3 and 5, a series of sets of experimental data Y are obtained as the prototype is repeatedly modified. Each time an incremental change Δx is made in the prototype structure, the resultant change Δy in prototype product characteristics of the prototype is measured in the process.

Such data can be used for correcting the sensitivity Jacobian. The major difference from the purely experimental method is that the correction of J is performed on-line during the design and re-design process of the prototype, as opposed to the off-line determination based on preliminary experiments. Thus, great time savings are made, since the Jacobian is refined as the prototype is being refined. Therefore, neither the Jacobian nor the prototype need begin in a highly refined state. Rather, imprecise estimates for each may be made initially, and the design method of the invention causes successive prototypes and Jacobians to converge to more precise versions of each. Further, the incremental refinement of the Jacobian and the prototype is a systematic method that can be automated.

The recursive least square parameter estimation method may be applied to the on-line correction of the sensitivity Jacobian. Let Δx[t−1] be the incremental change of design features of the prototype at the [t−1]st iteration, and ΔY$_i$[t−1] be the resultant change in the i-th component of the prototype product characteristics vector. If frequency responses are used for the prototype product characteristics, as used in the example above, ΔY$_i$[t−1] is given by $$\Delta Y_i[t-1]=|logG_y[jw_i; t-1]|-|logG_y[jw_i,t-2]| \quad (8)$$

where G$_y$[jw$_i$ ; t−1] is the magnitude of the frequency transfer function of the physical prototype system evaluated at frequency w=w$_i$ after the [t−1]st design change, Δx[t−1], is made for the prototype structure. This transfer function magnitude is compared with the corresponding magnitude at the [t−2]nd iteration to obtain ΔY$_i$[t−1].

To formulate the recursive estimation steps, the sensitivity Jacobian is rewritten as $$\underline{J}[t] = \begin{bmatrix} \theta_1^T[t] \\ \cdot \\ \cdot \\ \cdot \\ \theta_m^T[t] \end{bmatrix} \quad (9)$$

where θ$_i^T$[t] is the 1 by n vector consisting of the i-th row of the Jacobian at the t-th iteration of the on-line estimation. The estimation of the Jacobian is performed for individual rows, i.e., for the changes in a single prototype product characteristic (in this case, frequency), brought about by changes in all of the physical design features of the prototype (in this case, thickness changes along its entire length). The estimation error δ$_i$[t−1] of ΔY$_i$ based on the Jacobian row vector, θ$_i^T$[t−1] at the [t−1]st iteration is given by:

$$\delta_i[t-1]=\Delta y_i[t-1]-\theta_i^T[t-1]\Delta x[t-1] \quad (10)$$

Using this error, the i-th row θ$_i^T$[t] is updated as:

$$\theta_i[t] = \theta_i[t-1] + \frac{\underline{P}[t-2]\Delta \underline{x}[t-1]}{1+\Delta \underline{x}[t-1]^T\underline{P}[t-2]\Delta \underline{x}[t-1]} \delta_i[t-1] \quad (11)$$

and $$\underline{P}[t-1]=\underline{P}[t-2]-\frac{\underline{P}[t-2]\Delta \underline{x}[t-1]\Delta \underline{x}[t-1]^T\underline{P}[t-2]}{1+\Delta \underline{x}[t-1]^T\underline{P}[t-2]\Delta \underline{x}[t-1]}, t \geq 1 \quad (12)$$

where P(i−1) is any positive definite variance matrix, and θ$_i$[0] is the i-th row of the sensitivity Jacobian obtained off-line prior to the recursive structure re-design. Typically, the positive definite matrix begins as the identity matrix. As the process proceeds, it changes, and essentially records the history of the changes over the previous iterations. It may be beneficial to use the computational method based on a finite element model for the initial, off-line estimation of the sensitivity Jacobian.

Analysis of the Sensitivity Jacobian

Figure 6:
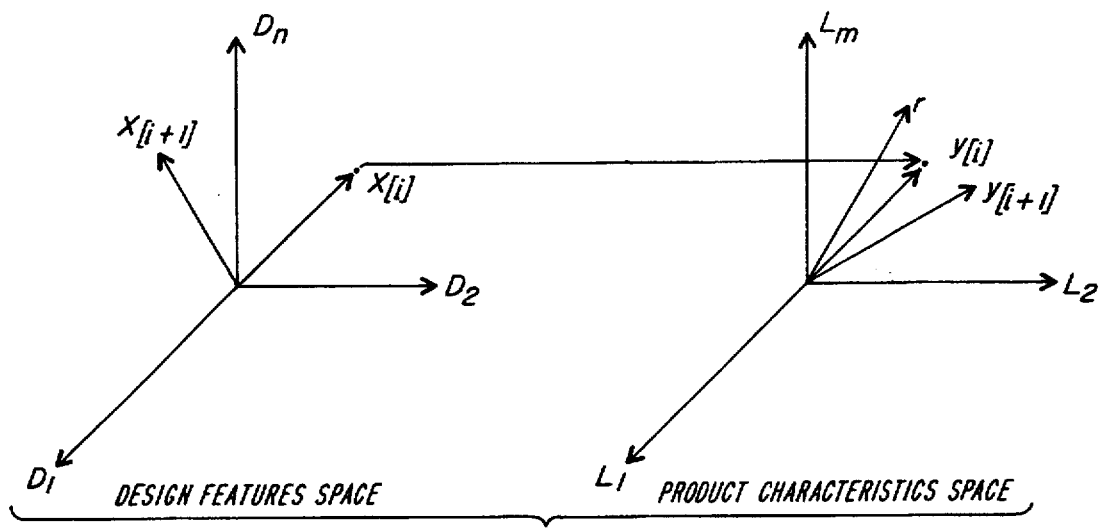
FIG. 6 shows graphically a relation between a design variable physical features space and a product characteristics space, for illustration of the relationship between product characteristics and the physical features.
Figure 7A:
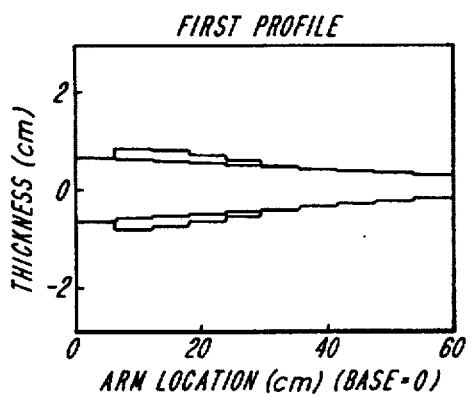
FIGS. 7A, 7B, 7C and 7D show (from above) the profiles of an arm, at stages of prototyping during the recursive steps of a version of the method of the invention.
Figure 7B:
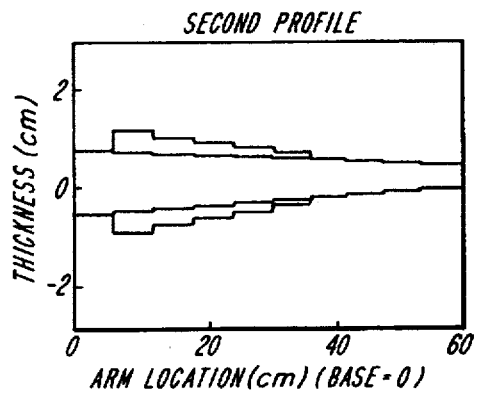
Figure 7C:
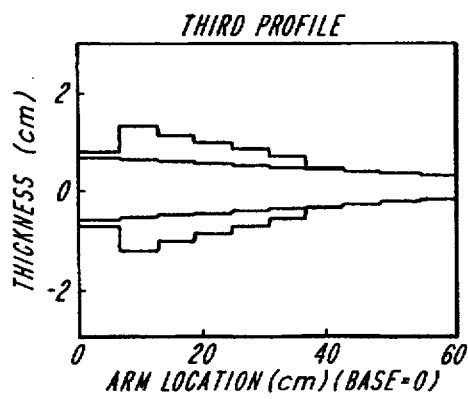
Figure 7D:
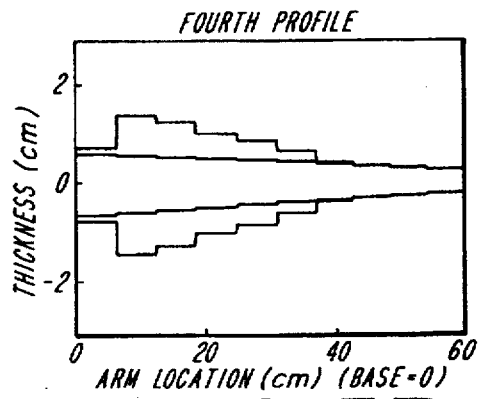

FIG. 6 shows schematically the physical meaning of the Jacobian. The Jacobian J provides a linear mapping from the n-dimensional design variable physical feature space (defined by axes D$_1$ through D$_n$) to the m dimensional product characteristics space defined by the product characteristics axes L$_1$ through L$_m$. One point, or vector r in the m dimensional space defines the specified reference model, and another point or vector y defines the then prototype. A set of points Y$_{[i]}$ defines the various prototypes as they are changed from one iteration to the next. Similarly, in the variable features space, one vector or point represents the values x for the prototype at a given iteration, while another such vector or point corresponds to the values E for a different iteration.

Representative Design Project and Apparatus

The general example used above has been the design of a robot arm using a repetitive coating technique to change the product characteristics of the prototype. That example will now be discussed in more detail. The robot arm under design is to be a light weight high speed robot with an arm link structure specifically appropriate for high speed positioning. An embodiment of the apparatus of the invention, as use to design such an arm is shown schematically with reference to FIG. 8. The overall system configuration consists of an experimentation unit 802, a structure reinforcement unit 804 and a computer 806 for providing inputs to each, and for accepting outputs from the experimentation unit 802. The computer 806 is also provided with an input and output unit 808, such as a keyboard and a video display terminal, for accepting inputs from the user and providing output to the user.

The experimentation unit 802 is connected to a direct-drive motor 810, which drives an arm link prototype 812 under design, to be reconfigured by the apparatus of the invention. The experimentation unit 802 includes a motor driver 814 with a high resolution encoder and means 816 for receiving signals generated by and sending control signals to, any sensors, such as 818, indicated schematically, used to sense the performance of the prototype arm 812. Additional sensors may be included in or connected to the direct drive motor 810, to generate signals representative of torque, rotational frequency, etc. In this particular embodiment, the need for any additional sensors 818 other than those more intimately connected to the motor 810 is minimal. However, other sensors, such as strain gauges, temperature sensors, position sensors, etc., could be used if the particular application so warrants, as will be understood by one of ordinary skill in the art.

The structure reinforcement unit 804 implements photopolymerization technology. As explained in detail in the following section, a type of liquid polymer is used, which solidifies rapidly when exposed to ultra-violet light. The liquid plastic is applied with a dispenser by moving a dispenser head 820 to a target position adjacent the arm link 812. A positioner 824 moves the dispenser head 820 to a desired position. Ultraviolet light sources 822 and 823 provide light of the proper intensity and duration, so that the photosetting polymer hardens in place. The light source 822 may move with or behind the dispenser head 820, either sharing the positioner 824 or having its own, or it may cover a larger area and be stationary. Once the plastic solidifies, the arm structure is reinforced at that particular point on the arm link. Operation of these components, including the positioner 824, UV light source 822, and dispenser head 820 is coordinated by the computer 806 under the control of a properly designed digital computer program, or under the direct control of a user.

Experiments are conducted, where controlled input signals are provided to the motor and data signals are acquired from the appropriate sensors as to the resultant output of the prototype arm. The computer may be programmed to relate the controlled input signals to the signals representing the measured motion of the arm, to determine the relevant transfer functions, which constitute the prototype product characteristics y. Rather than transfer functions, appropriate sensors and programming can be provided to gather information about other forms of product characteristics, as discussed above.

The computer also keeps in a memory the list of specified product characteristic values r, to which measured prototype product characteristics y are compared. Another task accomplished by the computer is to monitor the changes $\Delta x$ in the design feature values x of the physical prototype, such as in this case, its thickness at certain locations. Additional sensors can be provided to measure design features, such as thickness, to insure that the changes to structure commanded by the computer are in fact realized. As discussed above, the computer is programmed to use the signals representing the changes in design features, the prototype product characteristics and changes therein, to determine modifications to a Jacobian for use in the method of the invention discussed above. As each cycle of changing the prototype and then testing it takes place, a new estimate for the Jacobian is made by the computer, and the new Jacobian is applied.

Figure 8:
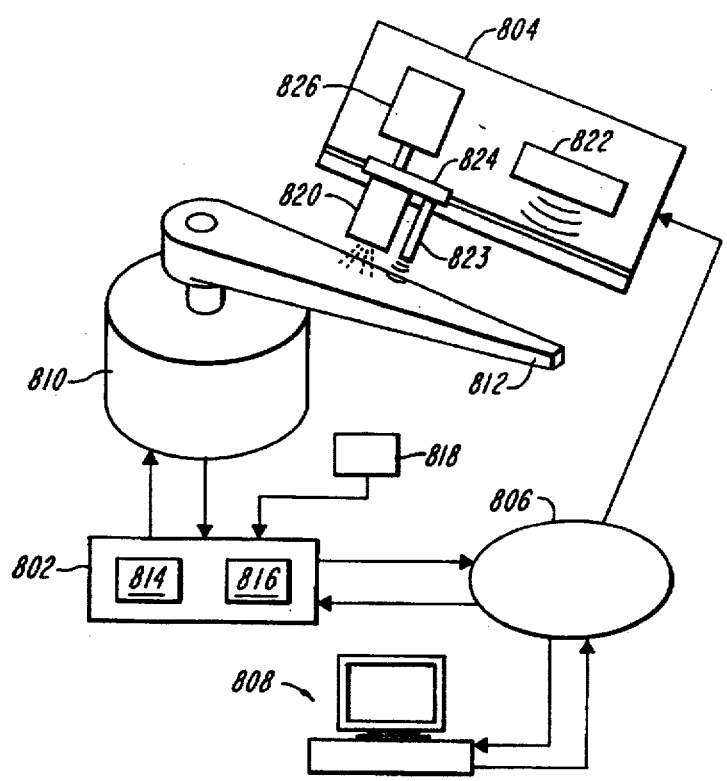
FIG. 8 shows schematically a version of the apparatus of the invention for rapid and recursive design modification of a mechanical arm.

Thus, the apparatus shown in FIG. 8 is an implementation of the general apparatus shown schematically in FIG. 3, albeit organized along different lines. The prototyping unit 320 includes the structure reinforcement unit 804 under the control of the computer 806 and the arm 812. The analysis unit 316 includes the sensors 818, the motor 810 and its controller 814, any internal sensors, and the sensor interface 816, all under control of the computer 806. The Jacobian application unit 322 and Jacobian adjustment unit 324 are embodied in the computer, as programmed, to perform the steps discussed above. The comparators 318 and 330 are also implemented by the computer. The specified product characteristics memory 312 for storing the list of specification values r may be a computer memory, as are the memories 326 and 328 for storing iterations of the prototype product specifications y.

After a round of experiments are taken, portions of the arm are coated with reinforcement material, which solidifies quickly. A suitable coating technique is based on photopolymerization. Commonly used in stereolithography (See generally, Ashley, S., "Rapid Prototyping Systems," Mechanical Engineering, April 1991, which is incorporated herein by reference), in photo-polymerization, liquid polymers are solidified using ultraviolet light. The level of solidification depends on the amount of cross-linking between the polymer chains that make up the solidified fluid. This level of cross-linking is directly dependent on the amount of energy absorbed through exposure to ultraviolet light. A suitable photopolymer, such as a photo-acrylate, not only forms a rigid polymer, it also bonds well to aluminum and extremely well to acrylic. In the work described, the robot arm 812 was made of acrylic plastic. A plastic is useful for a robot arm because of its favorable concurrent stiffness and damping characteristics. Adding plastic increases both the stiffness and the damping. However, as is well known, plastic manipulators are very difficult to model due to their non-linear internal damping. Because the method of the invention does not need a reliable model, it is particularly useful for design of a useful structure whose characteristics are inherently difficult to predict using a theoretical approach.

The product characteristics of a structure such as the robot arm 812 may be modified by coating selectively. The level of change depends on the amount of plastic applied. The coated plastic increases both the stiffness and damping of the arm. Using the photo-polymerization form of structure change has at least two desirable features. First, it is a proven technology; since the late 1980's photo-acrylate plastics have been widely tested. Thus, the material is both readily available and reliable. Secondly, the process is easy to control, reliable, and repeatable. This simplifies the development of the controller which control the placement of new material onto the prototype thickness and location of the coating. The controller may be implemented using a DA board connected to the linear slide of the structure reinforcement unit 804. A suitable linear slide is made by THK, of Japan, under model designation THK-IA.

Thus, the combination of using a prototyping method that itself can be entirely machine controlled, and using a recursive design technique, where a Jacobian is itself recursively adjusted based on the past history of prototype modification, permits a substantially automated product design method. After the initial inputs are provided (an initial prototype, an initial Jacobian, and specified values for product characteristics) a signal processing machine, such as an appropriately programmed general purpose computer or a specifically designed computation engine, can monitor and operate the entire project.

A suitable set of computer programs for the initial off-line creation of and subsequent on-line modification of the Jacobian is shown in the attached Appendix. Typically, the programming for the various components of the system requiring control, such as the linear slide and pump for dispensing the fluid and the motor and sensors for testing the prototype, depends on the specific equipment being used. Development of such programs would be within the abilities of one of ordinary skill in the art. The example programs set forth in the Appendix largely consist of forming an interface between a FEM program, such as ADINA, identified, and a mathematics processor, such as MATLAB, available from Mathworks of Natick, Mass..

The Main Routine is the program which controls the initial calculation of the first version of the Jacobian, before any recursive changes to the prototype or the Jacobian have been made. It calls a program entitled "bdata", which provides the physical characteristics of the modeled prototype, such as the yield stress and the modulus, and puts those characteristics into a format for input into the mathematics processor. The mathematics processor makes small changes to the computer model's physical features and recursively calls the FEM so that the effect of the changes on output characteristics can be seen. During the course of these recursive calls, the main program also calls a program called "thee," which converts a MATLAB program file into an input file in the format called for by ADINA. The "read_arr" program, also called by the main routine, reads the mass and stiffness matrices from a file and writes them out in a format suitable for manipulation by the MATLAB program. The "new" program links the output from the FEM package ADINA back to the mathematics processor MATLAB.

The program entitled Recursive Least Squares changes the Jacobian as at step 524, shown in FIG. 5. Thus, the general purpose computer functions as the Jacobian adjustment unit 324, shown in FIG. 3. This program takes as inputs the actual changes of coating that have been made (which should be measured, since the actual changes made may not be exactly equal to the changes dictated by the change x signal due to imprecision in the prototyping unit). Additional inputs are the prototype characteristics for the current prototype and for the previous prototype. From these values, the program calculates the new Jacobian, using the equations 8–12 above.

The acrylic arm, shown in FIG. 8, was treated by the apparatus shown in FIG. 8, according to the method of the invention shown in FIG. 5. The arm consisted of a tapered acrylic link, 600 mm long, and 25 mm high (the vertical dimension). Divided in ten sections along its length, the width of the arm decreased from 12.7 mm at the base (nearest to the motor axle) to 4.7 mm at the tip in 0.8 mm intervals. The arm was found to have the first two heavily damped non-rigid body modes at 7.5 Hz and 25 Hz. The direct drive motor 810 had 5 Nm in peak torque. The direct drive motor, made by Panasonic of Japan, under trade designation DD-educational robot, incorporates a high accuracy encoder, which measures the angular position of the arm and generates a signal representative thereof.

The liquid photo-acrylate plastic applied to the arm 812 as the means of modifying the product characteristics is a non-toxic viscous fluid of 1500 cp, giving it a consistency similar to that of molasses. The plastic was applied onto the arm 812 through a high vacuum pump 826, manufactured by Kahnetics of Bloomington, Calif., under product designation KDS 824, Deluxe shot meter included in the coating reinforcement unit 804, connected with a nozzle ten mm long and 1 mm wide. The plastic is applied on both sides of the arm's structure at a rate of ten cm/min, in layers roughly 0.3 mm thick. The plastic is pumped at 60 psi using a high viscosity valve dispenser, such as sold by Kahnetics under product designation KDS-760. The vacuum pull back feature of the pump is used to control the amount of liquid dispensed. A one inch nozzle is maintained at a 45° angle, roughly 3 mm above the workpiece. This approach was used only in the dimension along the length of the arm. However, it could be used in the other two orthogonal dimensions to make more complex three dimensional shapes.

In the illustrated embodiment, only a single plastic dispenser head 820 is used. However, more than one dispenser could be used, or a series of jets could be provided surrounding the article to be fabricated, such as in a paint spraying booth. After the plastic is applied over an area of approximately 10 cm$^2$, the area is scanned for four minutes with a UV curing light (350 nm, 2 W) gun 823, which concentrates its UV emission through an optic fiber onto a 1 cm$^2$ area, such as sold by Electro-Lite Corporation of Danbury, Conn., under trade designation "Teklite UV". This solidifies the plastic substantially (preventing dripping) and smoothes the reinforcement surface. Next, the entire arm is bathed under 2.5 W UV bulb 822 for 15 minutes, such as sold by Electrolite under product designation ELC-250. This post-cures the plastic and solidifies it to its final state. Since both the added photopolymer and the original arm 812 are acrylic plastics they form an exceptionally strong bond to each other.

All of the foregoing equipment may be controlled by an IBM brand computer, model number PS-2, which is capable of analyzing the data from the sensors, and performing calculations to compare the prototype characteristics with the specifications and from one iteration to the next, and to apply and modify the Jacobian. The personal computer is also capable of providing instruction signals to the rapid prototyping equipment, namely the coating application unit (slide, pump and lights) and the experimental input motor.

Experimental Results

Figure 9:
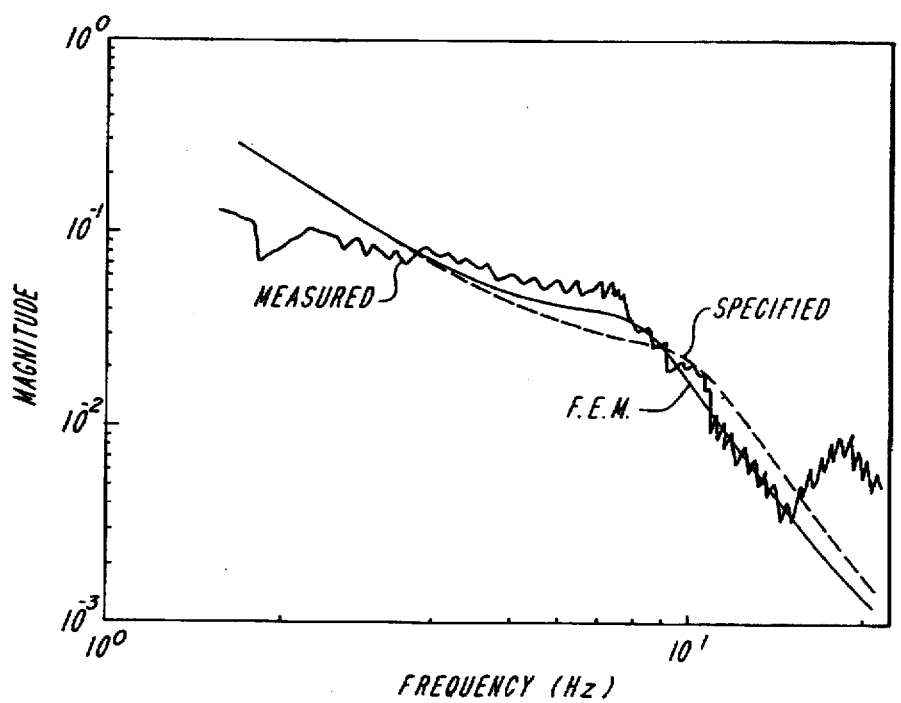
FIG. 9 shows graphically a product characteristic specification frequency response for a robot arm, compared to a frequency response of a proposed (non-physical) design, determined by a finite element model and to a frequency response obtained by measuring a physical prototype robot arm.

As described above, it is first necessary to establish an initial sensitivity Jacobian for the acrylic robot arm 812. An acceptable approach is to begin by modeling the arm using a Finite Element Model ("F.E.M.") Package: (such as is available from ADINA Finite Element Analysis Software, 71 Elton Ave., Watertown, Mass.). Using the arm's material properties and a simple model for damping, the frequency response of the arm can be predicted as shown in FIG. 9 (solid line). The damping incorporated in the model was proportional damping: with alpha proportional to an M matrix equal to 0.007 and beta proportional to the K matrix equal to 0.01. The F.E.M. was used to theoretically determine the change in frequency response of the prototype arm at 121 frequency intervals between 10 and 130 rad/s for small changes of arm thickness at each of the ten consecutive locations along the tapered arm. Thus, in accordance with the discussion above, the changes in frequency response correspond to the changes $\Delta y$ in the values y for the prototype product characteristics and the changes of arm thickness correspond to the changes $\Delta x$ in design variable physical features x.

A reference model of specified product characteristics constitutes a desired frequency response, as shown in FIG. 9 (dotted line). This model has the first natural frequency of the specified arm at 11 Hz. rather than the 7.5 Hz exhibited by the original prototype arm. The frequency response of the real arm was also measured for the same frequency intervals described above. This was done by inputting a frequency varying sine wave torque input to the direct drive motor 810. To stabilize the system while measuring the magnitude response a P-controller was implemented using a very small P gain of 0.0001. The results of the experimental frequency response testing is shown in FIG. 9 (jagged solid line).

Figure 10:
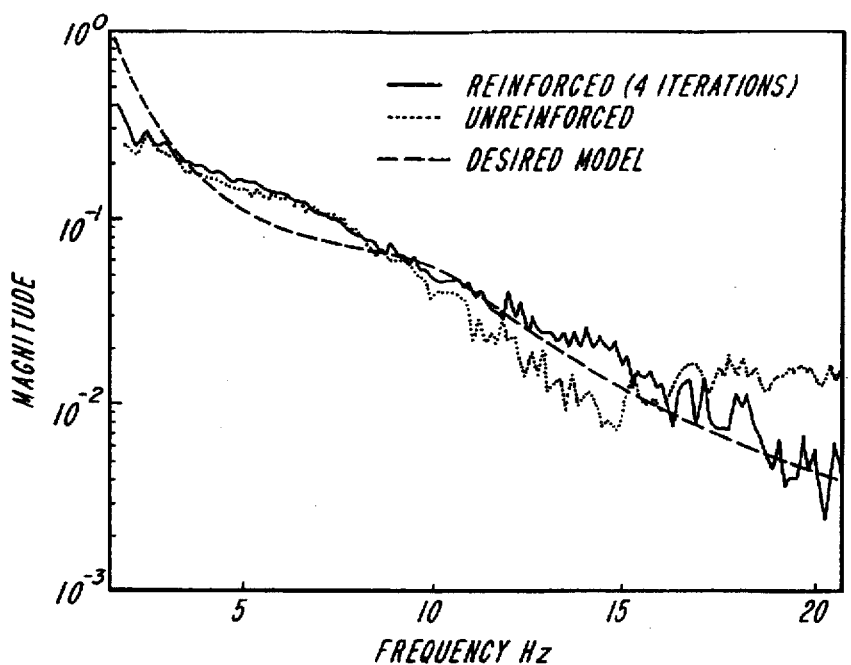
FIG. 10 shows graphically a comparison among a specified product characteristic frequency response, the characteristic frequency response of the original unaltered prototype; and the frequency response of a prototype generated by four recursive steps of a version of the method of the invention, using a version of the apparatus of the invention.

After generating initial values for the sensitivity Jacobian, the specified reference model, and after identifying the frequency responses of the non-reinforced arm, the steps of the method were applied, using the apparatus described. The process was cycled through four times by modifying the arm physically and updating the Jacobian using the recursive techniques described earlier. The final frequency response curve after four iterations is shown (solid line) in FIG. 10, together with the specified frequency response curve (dashed line) and the frequency response of the original unreinforced arm (dotted line).

The graph shows that the reinforced frequency response converged towards the desired specifications. The pole of the unreinforced arm located at 15 Hz is shifted off the range to the right after the reinforcement was placed on the arm.

Figure 11:
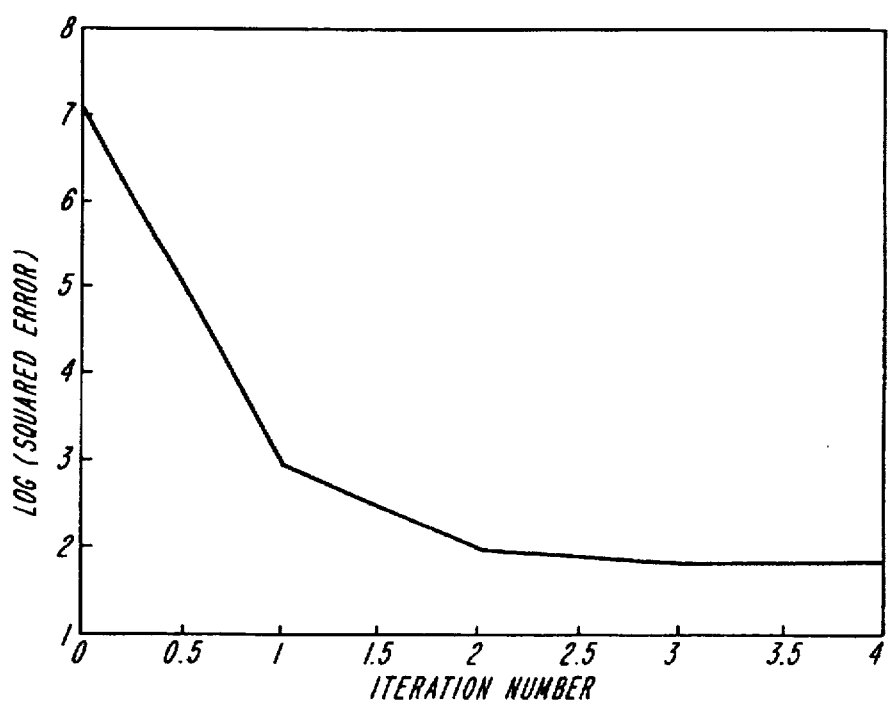
FIG. 11 shows graphically a comparison between the Log of the squared error between the specified product characteristics and the prototype product characteristics, compared to the cycle iteration number.

To examine the convergence of the iterative process, the squared error between the specified response (specified product characteristics) and the actual arm response (prototype product characteristics) can be evaluated. FIG. 11 shows the logarithms of the squared error against the iteration number. Starting off with an error of 7.1, the error decreases monotonically down to 1.8. However, the net reduction of error reduces quickly in each step.

It is clear from this graph that the most significant convergence toward the specifications occurs after the first coating and the least amount of improvement occurs after the last iteration.

Figure 12:
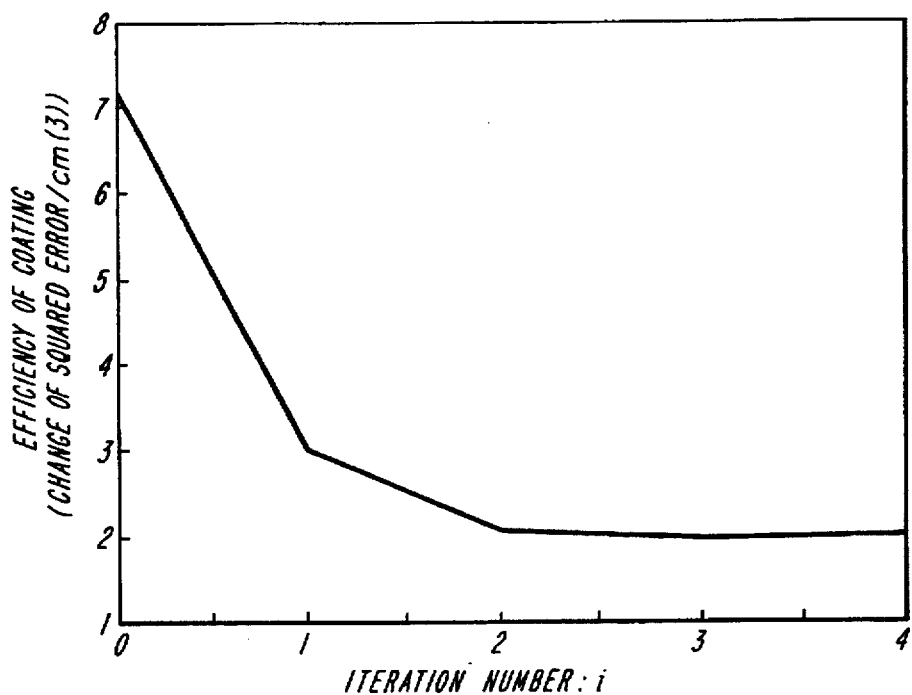
FIG. 12 shows graphically a comparison between the efficiency of a coating step compared to the cycle iteration number.

This situation can be visualized clearly by plotting the ratio of the total error reduction (squared error) in each step to the total volume or weight of reinforcement coating required for it. FIG. 12 shows the efficiency, which is the ratio of error reduction to coating amount, in each step. After the fourth iteration, the efficiency decreased significantly. No further improvement can be expected beyond this point, unless a very large amount of coating is allowed. Therefore the iterative process was terminated at that point.

Figure 13:
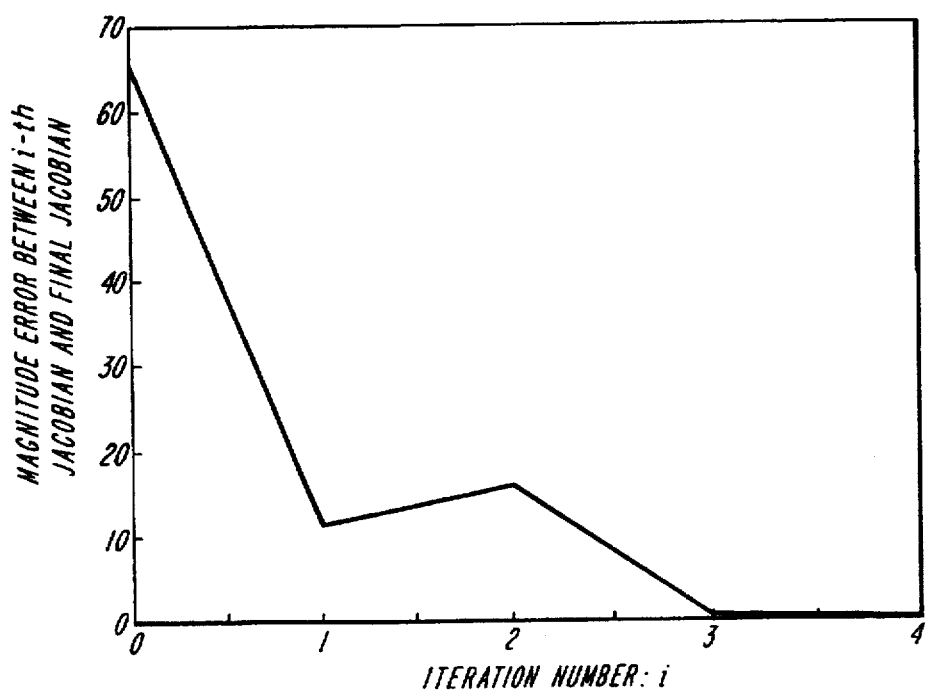
FIG. 13 shows graphically a comparison between the magnitude of the error between the ith Jacobian and the final Jacobian, compared to the cycle iteration number.

It is also beneficial to evaluate the effect of updating the Jacobian using recursive least squares techniques. FIG. 13 shows the evolution of the Jacobian being updated in the process. Each Jacobian is compared with the final Jacobian. The FIGURE shows the difference, using a squared norm, between the updated Jacobian after each iteration and the final Jacobian. This graph shows the usefulness of the hybrid method where the Jacobian was initially derived from a F.E.M. model and corrected by using experimental data. The more prototype profiles and responses (product characteristics) that are obtained, the more accurately the Jacobian reflects the actual arm.

The four successive arm profiles (viewed from the top) resulting from the coatings are shown in FIGS. 7A–7D. In this case, only the side-to-side width of the article was changed, leaving the top-to-bottom height unchanged. However, in a typical case, both may be changed. FIGS. 7 also show that more volume of material was added to the last profiles than to the first ones. This observation relates to the task of determining an appropriate stopping point for the recursive process.

The ability of the apparatus illustrated to match the specified frequency response product characteristics is limited due to the process of using only additive coatings. However, the fundamental concept and advantage of rapid recursive structure re-design has been demonstrated. Without the removal of material the method achieves a good, however possibly sub-optimal solution. Using an alternative fast, on-line hardware setup that incorporates product removal will permit achieving an optimal solution. Alternatively, the original prototype arm could have been made smaller in the dimension that ultimately required material removal, so that only additions would have been required.

It may also be possible to vary the target specified product characteristics to still achieve the designer's objectives, but with a different combination of characteristic properties. For instance, typically the specified characteristics are fulfilled by a variety of combinations of inertia and natural frequency. Thus, if natural frequency is more important than inertia, it may be possible to choose a different inertia for the final inertia, thereby permitting achievement of the specified natural frequency using the available starting materials and prototyping apparatus.

Any variation in the type of prototyping technique is within the scope of the invention. For instance, any appropriate form of material removal may be used, such as using an automated CNC lathe, grinder or milling machine. For a photopolymerization apparatus, different types of photopolymers, having different properties from each other, can be used. This allows for a wide selection of coating properties. Rather than using a process where a prototype is gradually built up or reduced, an entire new prototype can be made for each cycle, if such a fabrication can be done rapidly enough. Such may be the case for micro-machining, or other techniques where the specification for an entire part is maintained in computer memory or the like, and the fabrication of the part from start to finish may be very quick. Such processes include: 3-D printing, (See, Sachs, E., Cima, M., Brancazio, D., et al. "Three Dimensional Printing. Rapid Fabrication of Molds for Casting", Advances in Integrated Product Design, ASME, 1990); stereolithography, see generally, Deitz, D., "Stereolithography Automates Prototyping", Mechanical Engineering, Feb. (1990); those discussed in Ashley, S., "Rapid Prototyping Systems," Mechanical Engineering, (April 1991), all of which documents are incorporated herein by reference. Even if a new prototype is made at every iteration, the means by which the design features of the prototype are determined uses the incremental Δx vector discussed above, rather than a complete return to the drawing board, where analysis is made of the relationship between the design variable features and the product characteristics L.

The material may be added or removed from all surfaces of the article under prototyping, including inside surfaces. The material structure may be altered, such as by sintering, or by processes that remove material from inside structures, either chemically or by elevated temperatures.

Any type of specified product characteristics L may be achieved using the invention. For instance, acoustic, vibrational, reflective or damping properties may be achieved. Other properties that can be targeted include but are not limited to mass and density.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Main Routine

```
1       % Off-line Jacobian Training %
2       % Interfaced with Adina on Matlab %
3
4
5       for x=1:10
6               ! rm junk
7               ! rm ibeam.in
8               bdata
9
10              h(x)=h(x)+0.01;
11              thee
12              ! xadin < ibeam.in > junk
13              ! rm junk
14              ! xadout < fort.2 > junk
15              ! /home/cidms.home/aopil/adina/read_arr
16              new
17
18              A(8,1) = 0;
19
20              [testfl(1:1000,x),qwp]=bode(A,B,Cp,D,1,t);
21              h(x)=h(x)-0.01;
22
23
24      end
25
26
27
28
29
30
``` bdata

```
1    % Matlab Input File %
2    % Physical Characteristics of the Modeled Prototype %
3
4
5    PI=4*atan(1.0);
6    hub_in = 0.04; %Concentrated Hub Inertia
7    tip_m = 1 ; %Concentrated Tip Mass
8    b_el=10:
9    b_len=0.350;
10
11   h(1)=0.04;
12       h(2)=0.04;
13     h(3)=0.04;
14     h(4)=0.04;
15     h(5)=0.04;
16     h(6)=0.04;
17     h(7)=0.04;
18     h(8)=0.04;
19     h(9)=0.04;
20     h(10)=0.04;
21   % h(1)=0.05;
22   % h(2)=0.05;
23   % h(3)=0.04;
24   % h(4)=0.035;
25   % h(5)=0.03;
26   % h(6)=0.03;
27   % h(7)=0.025;
28   % h(8)=0.02
29   % h(9)=0.02;
30   % h(10)=0.01;
31
32   h2 = 0.0254;
33
34   end
``` thee

```
1   % Converts matlab file into an Adina Input File %
2
3
4
5   fprintf('ibeam.in','*adina-in input file \n fileunits list=8 log=7 echo=7 \n control
    plotunit=cm plotsave=yes \n database operation=create \n head "MODELLING A Rectangular
    SHAPED ARM" \n master idof=100011 \n');
6
7   fprintf('ibeam.in',' tapes ikm=1 \n analysis ty = dynamic ma=consistent \n frequencies
    subspace-iteration neig=7 nmode=7 ifpr=1 irbm=1 cofq=1.0e12 \n printout volume=maximum
    \n porthole formatted=yes file=60 \n = \n');
8
9   fprintf('ibeam.in','coordinates \n entries  node  y  z  \n      1  0.0  0.0 TO \n');
10
11  fprintf('ibeam.in','       11 0.6 0.0 \n');
12  fprintf('ibeam.in','       12  0.9  0.9  \n');
13  fprintf('ibeam.in','* \n');
14  %fprintf('ibeam.in','material 1   elastic e=2.7e9 nu=0.35  density=1180 \n');
15  fprintf('ibeam.in','material 1   elastic e=0.7e9 nu=0.35  density=1180 \n');
16  fprintf('ibeam.in','egroup 1 beam displacement=small material=1 \n');
17
18  fprintf('ibeam.in',' section 1 rectangular h1=%g h2=%g sc=0.0 tc=0.0 \n',h(1),h2);
19  fprintf('ibeam.in',' section 2 rectangular h1=%g h2=%g sc=0.0 tc=0.0 \n',h(2),h2);
20  fprintf('ibeam.in',' section 3 rectangular h1=%g h2=%g sc=0.0 tc=0.0 \n',h(3),h2);
21  fprintf('ibeam.in',' section 4 rectangular h1=%g h2=%g sc=0.0 tc=0.0 \n',h(4),h2);
22  fprintf('ibeam.in',' section 5 rectangular h1=%g h2=%g sc=0.0 tc=0.0 \n',h(5),h2);
23  fprintf('ibeam.in',' section 6 rectangular h1=%g h2=%g sc=0.0 tc=0.0 \n',h(6),h2);
24  fprintf('ibeam.in',' section 7 rectangular h1=%g h2=%g sc=0.0 tc=0.0 \n',h(7),h2);
25  fprintf('ibeam.in',' section 8 rectangular h1=%g h2=%g sc=0.0 tc=0.0 \n',h(8),h2);
26  fprintf('ibeam.in',' section 9 rectangular h1=%g h2=%g sc=0.0 tc=0.0 \n',h(9),h2);
27  fprintf('ibeam.in',' section 10 rectangular h1=%g h2=%g sc=0.0 tc=0.0 \n',h(10),h2);
28
29  fprintf('ibeam.in','enodes \n  1 12 1 2 \n 2 12 2 3 \n 3 12 3 4 \n');
30  fprintf('ibeam.in','  4 12 4 5 \n 5 12 5 6 \n 6 12 6 7 \n 7 12 7 8 \n');
31  fprintf('ibeam.in','  8 12 8 9 \n 9 12 9 10 \n 10 12 10 11 \n');
32
33
34  fprintf('ibeam.in','edata \n entries el section \n');
35
36  fprintf('ibeam.in',' 1 1 \n 2 2 \n 3 3 \n 4 4 \n 5 5 \n 6 6 \n 7 7 \n 8 8 \n 9 9 \n 10
    10 \n fixboundaries123 / 2 12 \n');
37
38  fprintf('ibeam.in','egroup 2 SPRING \n prop N=1 M = 0.01 \n prop N=2 M =0.000002
    \nenodes \n 1 2 4 \n 10 11 3 \n');
39  fprintf('ibeam.in','edata \n ent el propertyset \n 1 1 \n 10 2 \n',tip_m);
40
41
42  %fprintf('ibeam.in','frame \n mesh nodes=11 bcode=a;; bcharacter=B node=11 elements=2
    \n')'
43
44  fprintf('ibeam.in','adina \n end \n');
``` read_arr (page 1 of 2)

```
1    /*This program reads the mass and stiffness matrices from the file fort.70
2      and writes them out in a format suitable for manipulation by matlab.
3    */
4
5    #include <stdio.h>
6    #define NEQ 31
7    FILE *fvar,*fvar1,*fvar2;
8    char dummy[65];
9    char fort[65]="fort.70";
10   char M_mat[65]="Mmat.m";
11   char K_mat[65]="Kmat.m";
12   int i,j;
13   int num, counter;
14   int MAXA[NEQ + 1];
15   double matrix[1000];
16
17
18   main()
19   {
20   fvar=fopen(fort,"r");
21   fvar1=fopen(M_mat,"w");
22   fvar2=fopen(K_mat,"w");
23
24   /* Read the alphabetical characters off from the file fort.70*/
25   for (i=0;i<2;i++)  {
26   fscanf(fvar,"%s",dummy);
27   }
28
29   for (i=0;i<(NEQ+1);i++)  {
30   fscanf(fvar,"%d %d",&num,&MAXA[i]);
31   }
32   /* Read the alphabetical characters off from the file fort.70*/
33   for (i=0;i<3;i++) {
34   fscanf(fvar,"%s",dummy);
35   }
36
37   for (i=0;i<MAXA[NEQ];i++) {
38   fscanf(fvar,"%d %lf ",&num,&matrix[i]);
39   /*printf("%.13e num=%d \n",matrix[i],num);*/
40   }
41
42   /*Initialize the K matrix to consist of zeros NEQ X NEQ */
43   counter = 0;
44   fprintf(fvar2," K = zeros(%d,%d);\n",NEQ,NEQ);
45   for (i=0; i<NEQ ; i++)  {
46   for (j=0; j<(MAXA[i+1] - MAXA[i]) ; j++)  {
47   fprintf(fvar2, " K(%d,%d) = %.13e; \n", (i-j+1), (i+1),matrix[counter]);
48   counter = counter + 1;
49
50           }
51
52   fprintf(fvar2," for i =1:%d \n ",NEQ);
53   fprintf(fvar2," for j =1:%d \n ",NEQ);
54   fprintf(fvar2," K(j,i) = K(i,j) ; \n");
55   fprintf(fvar2," end \n end \n");
56
57   /* Read the alphabetical characters off from the file fort.70*/
58   for (i=0;i<3;i++)  {
59   fscanf(fvar,"%s",dummy);
60   }
61
```

-60-

```
62      for (i=0;i<MAXA[NEQ];i++) {
63      fscanf(fvar,"%d %lf ",&num,&matrix[i]);
64      /*printf("%.13e num=%d \n",matrix[i],num);*/
65      }
66
67      /*Initialize the M matrix to consist of zeros NEQ X NEQ */
68      counter = 0;
69      fprintf(fvar1," M = zeros(%d,%d);\n",NEQ,NEQ);
70      for (i=0; i<NEQ ; i++)  {
71      for (j=0; j<(MAXA[i+1] - MAXA[i]) ; j++)  {
72      fprintf(fvar1, " M(%d,%d) = %.13e, \n",(i-j+1),(i+1),matrix[counter]);
73      counter = counter + 1;
74      }
75      }
76
77      fprintf(fvar1," for i =1:%d \n ",NEQ);
78      fprintf(fvar1," for j =1:%d \n ",NEQ);
79      fprintf(fvar1," M(j,i) = M(i,j) ; \n");
80      fprintf(fvar1," end \n end \n");
81
82
83      fclose(fort);
84      fclose(fvar1);
85      fclose(fvar2);
86      }
``` new

```
1       % Read in the data from the K and M files  %
2       % This program links Adina back to Matlab  %
3
4       Kmat;
5       Mmat;
6       PI = 4*atan(1.0);
7       NEQ = 31;
8       [V,D] = eig(K,M);
9       %Renormalize the eigenvectors so that V1'*M*V1 = I
10      DD = diag(V'*M*V);
11      CC = sqrt(DD);
12      for i=1:NEQ
13      V(:,i) = V(:,i)/(CC(i));
14      end
15
16      [lambda,k] = sort(diag(D));
17      %lambda = sqrt(lambda);
18      %lambda = lambda/(2*PI);
19      V = V(:,k);
20
21      %NM is the number of modes retained
22      NM = 4;
23      Om = eye(NM,NM);
24      for i=1:NM
25      Om(i,i) = lambda(i);
26      end
27      damping=beta*Om+alpha*eye(NM,NM);
28
29
30      %Now we form the state equations
31      %The actuator location defines the force vector
32      F1 = zeros(NEQ,1);
33      F1(4,1) = 1.0;
34      F = V'*F1;
35
36      %The sensor location the C matrix
37      C11 = zeros(1,NEQ);
38      C11(30) = 1.0;
39      C1 = C11*V;
40
41      A = [zeros(NM,NM) eye(NM,NM); -OM damping];
42      B = [zeros(NM,1); F(1:NM,1)];
43      Cp = [C1(1,1:NM)  zeros(1,NM)];
44      D = [0];
45
46      [z,p,k1] = ss2zp(A,B,Cp,D,1);
47      [num,den]=ss2tf(A,B,Cp,D,1);
48
49      %The performance indices are now calculated.  They are the first zero and the
50      %first pole.
51
52      z1 = abs(min(z));
53      p1 = abs(min(p(3:(2*NM))));
54      z1
55      p1
56      axis([-600 600 -800 800])
57      plot(z,'og');
58      hold on;
59      plot(p,'xr');
60      hold on;
61
62
```

```
1     % This is the Recursive Least Squares Program on Matlab  %
2     % It is used to update the Jacobian using the Hybrid Method  %
3
4
5
6     for i=1:n
7             error=y(n)-J(1:m,i)'*phi;
8             if (1+phi'*P(1:m,i)*phi)-=0
9             J(1:m,i)=J(1:m,i)+((P*phi)/(1+phi'*P*phi))*error;
10    end
11    P(1:m,i)=P(1:m,i)-(P(1:m,i)'*phi*phi'*P(1:m,i)/(phi'*P(1:m,i)*phi))';
12
13
14
15    DD1=sum(J-T);
16    sum(abs(DD1'))
```

We claim:

1. A method for the manufacture of a physical product exhibiting dynamic product characteristics L (a vector) with prototype values y (a vector) within an acceptable tolerance from specified values r (a vector) of said dynamic product characteristics L, the method comprising the steps of:

a. providing an initial physical prototype, which is described by design variable physical features D (a vector) having values x (a vector), which design variable physical features D govern the values Y of said dynamic product characteristics L;

b. providing an initial Jacobian set of rules J, which relates changes in the values x of said design variable physical features D to changes in the prototype values y of said dynamic product characteristics L;

c. physically testing the prototype by dynamically exciting it to determine the present prototype values y and generating a signal representing said present prototype values y;

d. generating a signal representing said specified values r and generating a dynamic product characteristics error signal, representing the difference, $\Delta s$ (a vector), between said prototype values y and corresponding of said specified values r;

e. if said difference represented by said error signal is not within said acceptable tolerance, performing the following steps repeatedly;

i. applying said Jacobian set of rules to said error signal to generate a change x signal representing change amounts $\Delta x$ to be made to the values x of said design variable physical features D;

ii. physically changing said prototype so that the values x of said design variable physical features D change by said amounts $\Delta x$;

iii. physically testing the prototype by dynamically exciting it to determine the present prototype values y and generating a signal representing said present prototype values y;

iv. generating a dynamic product characteristics error signal, representing the difference, $\Delta s$, between said prototype values y and corresponding of said specified values r; and v. evaluating said difference represented by said error signal;

vi. generating a prototype dynamic product characteristics difference signal, representing the difference, $\Delta y$, between said present prototype values y of said dynamic product characteristics L and the values y before the most recent change to said prototype;

vii. relating said prototype dynamic product characteristics difference signal to said change x signal to determine whether said Jacobian set of rules requires alteration; and viii. if said Jacobian set of rules requires alteration, altering said Jacobian set of rules.

2. The method of claim 1, further comprising the step of providing an automatic signal processing means for coordinating the steps of physically testing the prototype, generating said dynamic product characteristics error signal, and performing said repeated steps.

3. The method of claim 1, wherein said initial prototype has prototype values y that are outside of said acceptable tolerance from said specified values r of said product characteristics.

4. The method of claim 1, said changing step comprising photo polymer shaping.

5. The method of claim 1, said changing step comprising 3-D printing.

6. The method of claim 1, said changing step comprising the step of adding material to said prototype.

7. The method of claim 1, wherein said step of changing said prototype comprises the step of removing material from said prototype.

8. The method of claim 1, wherein said step of changing said prototype comprises the step of changing its surface characteristics.

9. An apparatus for automatically manufacturing a physical article, exhibiting dynamic product characteristics L (a vector) with prototype values y (a vector) within an acceptable tolerance from specified values r (a vector) of said dynamic product characteristics L, said article described by design variable physical features D (a vector) having values x (a vector), which design variable physical features D govern the values y of said dynamic product characteristics L, said apparatus comprising:

a. means for physically, dynamically exciting a physical prototype and means for measuring the dynamic product characteristic values y of said dynamically excited physical prototype;

b. means for comparing said measured dynamic prototype characteristic values y to the specified values r to generate a dynamic product characteristics error signal $\Delta s$;

c. means for applying a Jacobian set of rules, which relates changes in the values y of dynamic product characteristics L to changes in the values x of design features, to said dynamic product characteristics error signal $\Delta s$, to generate a change x signal;

d. means for making physical changes to said prototype based on said change x signal; and e. means for adjusting said Jacobian set of rules.

10. The apparatus of claim 9, said means for adjusting said Jacobian comprising:

a. means for comparing the dynamic product characteristic values y for a first version of a prototype, to the dynamic product characteristic values y for a second version of said prototype, to generate a prototype dynamic characteristics product difference signal;

b. means for relating said change x signal to said prototype dynamic product characteristics difference signal; and c. means for using said relation to change said Jacobian set of rules.

11. The apparatus of claim 9, said means for making physical changes comprising an automatic means for taking as an input an electromechanical signal and generating as an output a physical change to said prototype.

12. The apparatus of claim 9, said means for applying said Jacobian comprising a signal processor.

13. The apparatus of claim 12, said signal processor comprising a programmed general purpose digital computer.

14. The apparatus of claim 10, said means for relating said change x signal comprising a signal processor.

15. The apparatus of claim 11 said means for making physical changes comprising means for applying a photosetting plastic.

16. The apparatus of claim 15, said means for making physical changes further comprising means for pumping said photosetting plastic under pressure.

17. A method for automatically manufacturing a physical article, exhibiting dynamic product characteristics L (a vector) with prototype values y (a vector) within an acceptable tolerance from specified values r (a vector) of said dynamic product characteristics L, said article described by design variable physical features D (a vector) having values x (a vector), said method comprising the steps of:

a. physically, dynamically exciting a physical prototype;
  b. measuring the values y of said dynamically excited physical prototype;
  c. comparing said values y to the specified values r to generate a dynamic product characteristics error signal Δs;
  d. applying a Jacobian set of rules to said dynamic product characteristics error signal, Δs, to generate a change x signal to change the values x of design features;
  e. physically changing said prototype based on said change x signal;
  f. evaluating whether said Jacobian set of rules should be changed; and
  g. changing said Jacobian set of rules if said evaluation indicates change to be appropriate.

18. The method of claim 17, further comprising the step of conducting the following steps until said dynamic product characteristics error signal, Δs, is within said accepted tolerance:

a. physically, dynamically exciting said physical prototype and measuring the values y of said physical prototype;
  b. comparing said values y to the specified values r to generate a dynamic product characteristics error signal Δs;
  c. applying said Jacobian set of rules to said dynamic product characteristics error signal, Δs, to generate a change x signal; and
  d. physically changing said prototype based on said change x signal.

19. The method of claim 18, wherein said step of evaluating whether said Jacobian set of rules should be changed is based on a comparison of said change x signal and the difference between the dynamic product characteristics y of a prototype and the dynamic product characteristics of said prototype immediately before said most recent step of physically changing said prototype was conducted.

20. A method for the manufacture of a physical product comprising the steps of:

a. providing an initial prototype;
  b. physically, dynamically exciting said product and testing said prototype for satisfaction of specified dynamic product characteristics;
  c. using the results of said testing step to automatically generate a set of changes to be made to features of the structure of said prototype;
  d. automatically applying said set of feature changes to physically change the structure of said prototype using a rapid prototyping method; and
  e. repeating said testing, change generating and prototype changing steps until said prototype satisfies said specified dynamic product characteristics.

21. The apparatus of claim 9, said means for adjusting said Jacobian set of rules comprising an automatic means for taking as an input, signals representing said Jacobian set of rules, said change x signal and the dynamic product characteristic values y for two successive instances of said changing prototype, and generating as an output a new Jacobian set of rules.

22. A method for the manufacture of a physical product exhibiting dynamic product characteristics with prototype values within an acceptable tolerance from specified values of said dynamic product characteristics, the method comprising the steps of:

a. providing an initial physical prototype, which is described by design variable physical features that govern the values of said dynamic product characteristics;
  b. providing an initial Jacobian set of rules J, which relates changes in the values of said design variable physical features to changes in the prototype dynamic product characteristic values;
  c. physically, dynamically exciting said prototype and testing the prototype and generating a signal representing said prototype dynamic product characteristic values;
  d. generating a signal representing said specified values and generating a dynamic product characteristics error signal, representing the difference between said prototype values and corresponding of said specified values;
  e. if said difference represented by said dynamic product characteristics error signal is not within said acceptable tolerance, performing the following steps repeatedly;

i. applying said Jacobian set of rules to said error signal to generate a change signal representing change amounts to be made to the values of said design variable physical features;
    ii. physically changing said prototype so that the values of said design variable physical features change by said change amounts;
    iii. physically, dynamically exciting and testing the prototype to determine the present prototype values and generating a signal representing said present prototype values;
    iv. generating a dynamic product characteristics error signal, representing the difference between said prototype values and corresponding of said specified values;
    v. evaluating said difference represented by said error signal;
    vi. generating a prototype characteristics difference signal, representing the difference between said present prototype values of said dynamic product characteristics and the values before the most recent change to said prototype;
    vii. relating said prototype characteristics difference signal to said change signal to determine whether said Jacobian set of rules requires alteration; and
    viii. if said Jacobian set of rules requires alteration, altering said Jacobian set of rules.

23. An apparatus for automatically manufacturing a physical article, exhibiting dynamic product characteristics having prototype values within an acceptable tolerance from specified values of said dynamic product characteristics, said article described by design variable physical features, that govern the values of said dynamic characteristics said apparatus comprising:

a. means for physically, dynamically exciting a physical prototype and means for measuring the dynamic product characteristic values of said physical prototype;
  b. means for comparing said dynamic prototype characteristic values to the specified values to generate a dynamic product characteristics error signal;
  c. means for applying a Jacobian set of rules, which relates changes in the values of dynamic product characteristics to changes in the values of design features, to said dynamic product characteristics error signal, to generate a change signal;

d. means for physically changing said prototype based on said change signal; and e. means for adjusting said Jacobian set of rules.

24. The apparatus of claim 9, said means for adjusting said Jacobian set of rules comprising:

a. means for comparing the dynamic product characteristic values for a first version of a prototype, to the dynamic product characteristic values for a second version of a prototype, to generate a prototype dynamic product characteristics difference signal;

b. means for relating said change x signal to said prototype dynamic product characteristics difference signal; and c. means for using said relation to change said Jacobian set of rules.

* * * * *